(12) United States Patent
Riall et al.

(10) Patent No.: US 9,307,654 B2
(45) Date of Patent: *Apr. 5, 2016

(54) METHOD OF FORMING A PATTERNED MULTI-PIECE INSERT FOR AN OPHTHALMIC LENS

(71) Applicant: Johnson & Johnson Vision Care, Inc., Jacksonville, FL (US)

(72) Inventors: James Daniel Riall, Saint Johns, FL (US); Frederick A. Flitsch, New Windsor, NY (US); Randall B. Pugh, Jacksonville, FL (US); Sharika Snook, St. Augustine, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 143 days.

This patent is subject to a terminal disclaimer.

(21) Appl. No.: 13/832,647

(22) Filed: Mar. 15, 2013

(65) Prior Publication Data

US 2014/0259657 A1 Sep. 18, 2014

(51) Int. Cl.
*H05K 3/30* (2006.01)
*B29D 11/00* (2006.01)

(52) U.S. Cl.
CPC ............ *H05K 3/30* (2013.01); *B29D 11/00807* (2013.01); *B29D 11/00894* (2013.01); *Y10T 29/49146* (2015.01)

(58) Field of Classification Search
CPC ................... B29D 11/00817; B29D 11/00038; B29D 11/00826; B29D 11/00009; H01L 51/0002
USPC ............... 29/825, 592.1; 351/159.74, 159.39, 351/159.24–159.33; 425/192 R; 264/1.32, 264/1.36

See application file for complete search history.

(56) References Cited

U.S. PATENT DOCUMENTS

| | | | | |
|---|---|---|---|---|
| 5,232,637 A | * | 8/1993 | Dasher et al. | 264/1.32 |
| 5,512,371 A | * | 4/1996 | Gupta et al. | 428/412 |
| 7,931,832 B2 | * | 4/2011 | Pugh et al. | 264/1.32 |
| 8,080,187 B2 | * | 12/2011 | Tepedino et al. | 264/1.32 |
| 8,348,424 B2 | * | 1/2013 | Pugh et al. | 351/159.74 |
| 8,894,201 B2 | * | 11/2014 | Pugh et al. | 351/158 |
| 2004/0027536 A1 | | 2/2004 | Blum | |
| 2005/0001978 A1 | | 1/2005 | Ocampo | |
| 2005/0099594 A1 | | 5/2005 | Blum et al. | |
| 2005/0168688 A1 | | 8/2005 | Doshi et al. | |

(Continued)

OTHER PUBLICATIONS

European Search Report for Aphplication No. EP 14 15 9878 Date of Completion of Report Dec. 2, 2014.

(Continued)

*Primary Examiner* — Minh Trinh

(57) ABSTRACT

This invention is directed to a method of forming a patterned multi-piece insert for an ophthalmic lens. The method may include forming first insert front and back curve pieces. The method may further include depositing a conductive material onto one or both of the first insert front and back curve pieces and attaching an electronic component at least in part to the conductive material. The method may further include placing an adhesive material onto a surface of one or both of the first insert front and back curve pieces so that a first ophthalmic insert is sealed when the first insert front and back curve pieces are combined. The method may further include combining the first insert back and front curve pieces to form the first ophthalmic insert and applying a colorant to at least one surface of one or both of the first insert back and front curve pieces.

9 Claims, 15 Drawing Sheets

(56) References Cited

U.S. PATENT DOCUMENTS

| | | |
|---|---|---|
| 2006/0181676 A1 | 8/2006 | Tucker et al. |
| 2009/0244477 A1* | 10/2009 | Pugh et al. .................. 351/158 |
| 2010/0078838 A1 | 4/2010 | Pugh et al. |
| 2011/0279905 A1 | 11/2011 | Pugh et al. |
| 2012/0162600 A1 | 6/2012 | Pugh et al. |
| 2012/0218508 A1 | 8/2012 | Pugh et al. |
| 2012/0236524 A1 | 9/2012 | Pugh et al. |
| 2014/0190004 A1* | 7/2014 | Riall et al. .................... 29/825 |
| 2014/0192314 A1* | 7/2014 | Riall et al. .................. 351/158 |
| 2014/0259657 A1* | 9/2014 | Riall et al. .................... 29/841 |

OTHER PUBLICATIONS

Singapore Search Report for Application No. 10201400411R ; Date of submission of the request to the Intellectual Property Office of Singapore: Apr. 8, 2014 Date of actual completion of the search: Feb. 26, 2015; Date Singapore agent notified Johnson & Johnson: May 5, 2015.

Singapore Written Opinion/Application No. SG 10201400411R; Date of Written Opinion Dec. 18 2015; Date Johnson & Johnson informed Jan. 8, 2016.

\* cited by examiner

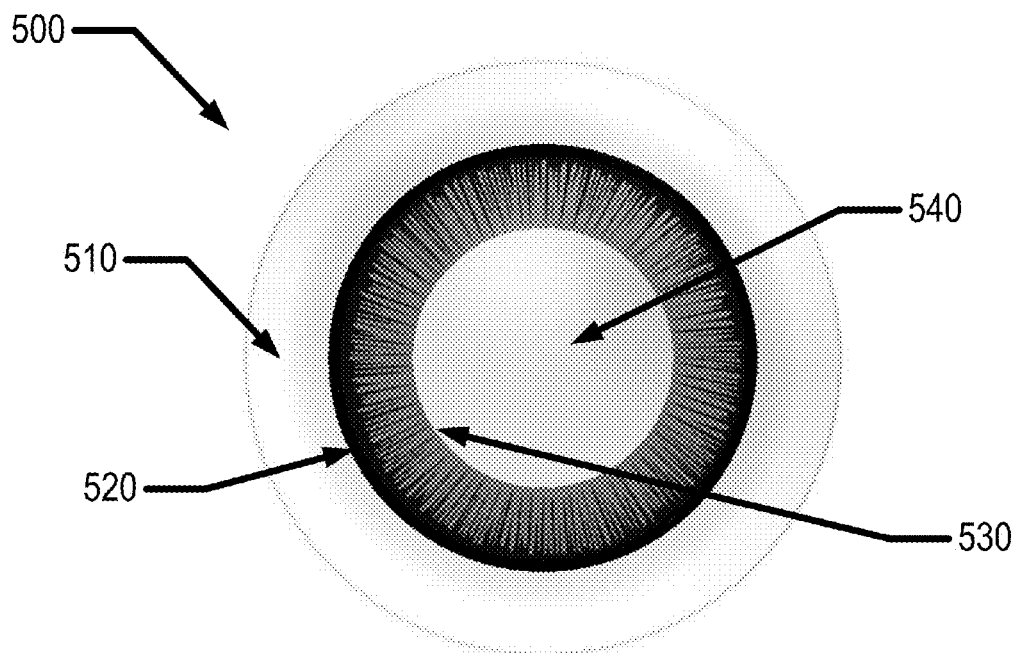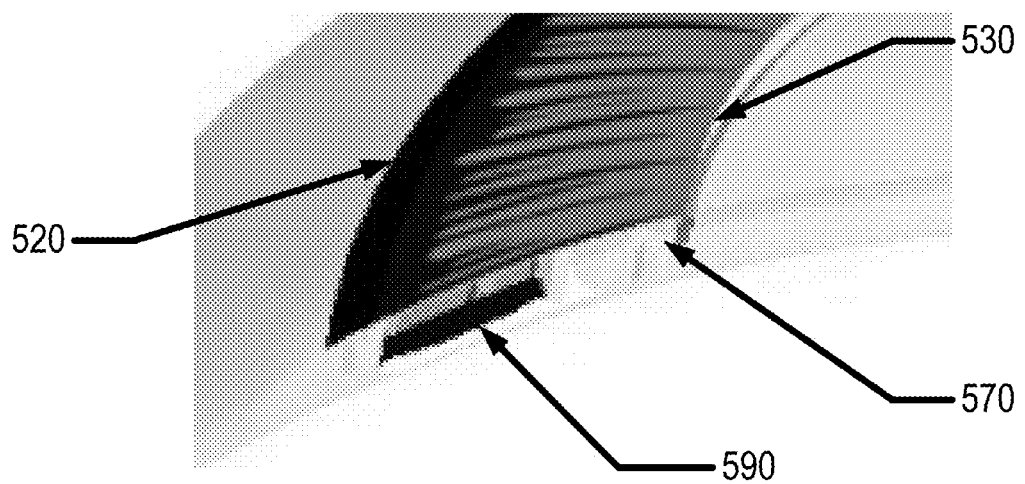
FIG. 5

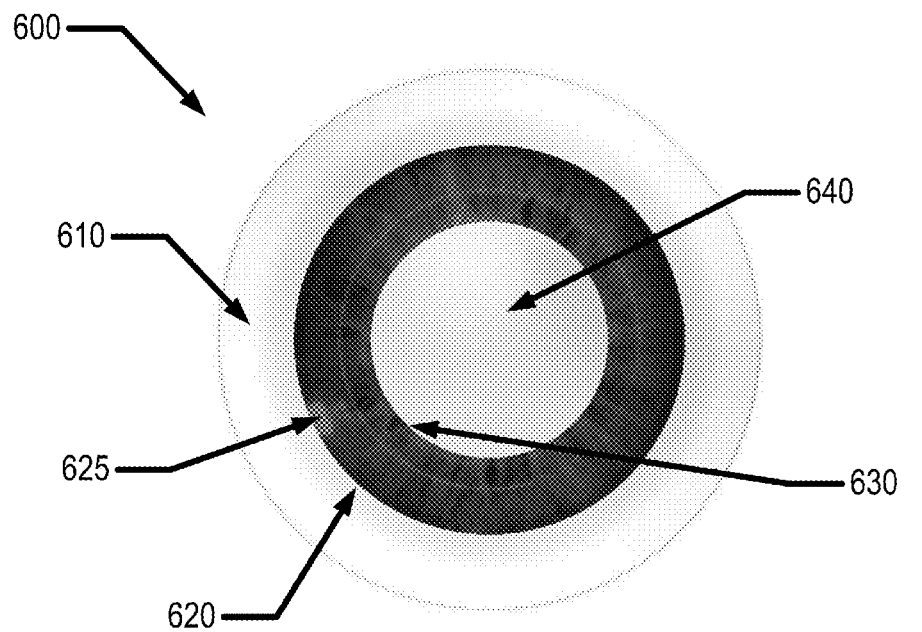
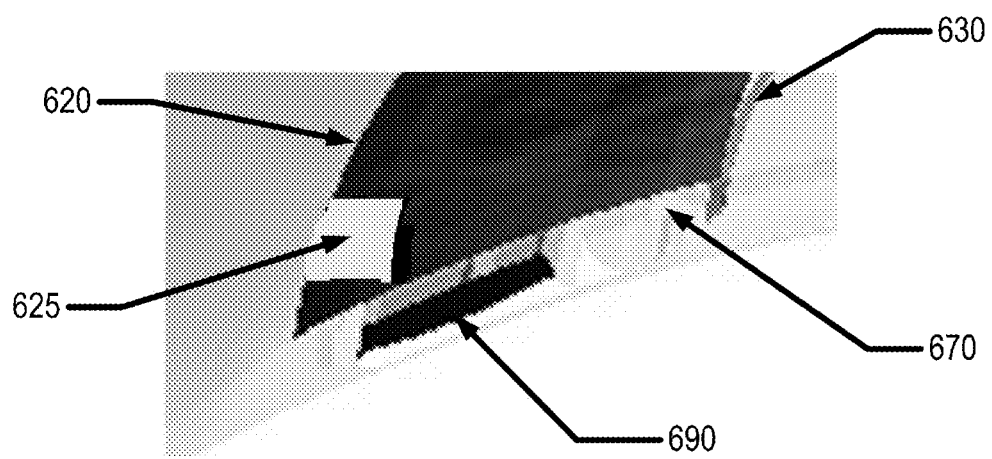
FIG. 6

```
┌─────────────────────────────────────────────────────────┐
│ FORM AN OPHTHALMIC INSERT FRONT CURVE PIECE WITH AT     │
│ LEAST A FIRST SURFACE PORTION FOR SEALING, AND          │
│ OPTIONALLY APPLY CONDUCTIVE TRACES AND ELECTRICAL       │
│ COMPONENTS                                        1001  │
└─────────────────────────────────────────────────────────┘
                            │
┌─────────────────────────────────────────────────────────┐
│ FORM AN OPHTHALMIC INSERT BACK CURVE PIECE WITH AT      │
│ LEAST A FIRST SURFACE PORTION FOR SEALING, AND          │
│ OPTIONALLY APPLY CONDUCTIVE TRACES AND ELECTRICAL       │
│ COMPONENTS                                       1002   │
└─────────────────────────────────────────────────────────┘
                            │
┌─────────────────────────────────────────────────────────┐
│ APPLY AN ADHESIVE MATERIAL TO ONE OR BOTH OF THE        │
│ FRONT CURVE PIECE AND THE BACK CURVE PIECE AND          │
│ COMBINE                                                 │
│                                                   1003  │
└─────────────────────────────────────────────────────────┘
                            │
┌─────────────────────────────────────────────────────────┐
│ APPLY A COLORANT MATERIAL TO ONE OR BOTH OF THE FRONT   │
│ CURVE PIECE AND THE BACK CURVE PIECE AND OPTIONALLY     │
│ CURE THE COLORANT MATERIAL                       1004   │
└─────────────────────────────────────────────────────────┘
                            │
┌─────────────────────────────────────────────────────────┐
│ DEPOSIT A REACTIVE MIXTURE IN A LOCATION BETWEEN OR     │
│ THAT WILL BE BETWEEN A FIRST MOLD PART AND A SECOND     │
│ MOLD PART                                         1005  │
└─────────────────────────────────────────────────────────┘
                            │
┌─────────────────────────────────────────────────────────┐
│ POSITION THE COMBINED INSERT WITH THE COLORANT          │
│ MATERIAL IN CONTACT WITH THE REACTIVE MIXTURE           │
│                                                   1006  │
└─────────────────────────────────────────────────────────┘
                            │
┌─────────────────────────────────────────────────────────┐
│ POSITION THE FIRST MOLD PART PROXIMATE TO THE SECOND    │
│ MOLD PART TO FORM A LENS CAVITY WITH THE REACTIVE       │
│ MONOMER MIX AND THE COMBINED INSERT IN THE              │
│ LENS CAVITY                                       1007  │
└─────────────────────────────────────────────────────────┘
                            │
┌─────────────────────────────────────────────────────────┐
│ POLYMERIZE THE REACTIVE MIXTURE TO FORM AN              │
│ OPHTHALMIC LENS                                         │
│                                                   1008  │
└─────────────────────────────────────────────────────────┘
                            │
┌─────────────────────────────────────────────────────────┐
│ REMOVE THE OPHTHALMIC LENS FROM THE MOLD PART           │
│                                                   1009  │
└─────────────────────────────────────────────────────────┘
```

FIG. 10

```
┌─────────────────────────────────────────────────────────┐
│ FORM AN OPHTHALMIC INSERT FRONT CURVE PIECE WITH AT     │
│ LEAST A FIRST SURFACE PORTION FOR SEALING AND           │
│ OPTIONALLY APPLY CONDUCTIVE TRACES AND ELECTRICAL       │
│                  COMPONENTS                      1101   │
└─────────────────────────────────────────────────────────┘
                            │
┌─────────────────────────────────────────────────────────┐
│ FORM AN OPHTHALMIC INSERT BACK CURVE PIECE WITH AT      │
│ LEAST A FIRST SURFACE PORTION FOR SEALING, AND          │
│ OPTIONALLY APPLY CONDUCTIVE TRACES AND ELECTRICAL       │
│                  COMPONENTS                      1102   │
└─────────────────────────────────────────────────────────┘
                            │
┌─────────────────────────────────────────────────────────┐
│ APPLY AN ADHESIVE MATERIAL TO ONE OR BOTH OF THE        │
│ FRONT CURVE PIECE AND THE BACK CURVE PIECE AND          │
│                    COMBINE                              │
│                                                  1103   │
└─────────────────────────────────────────────────────────┘
                            │
┌─────────────────────────────────────────────────────────┐
│ DEPOSIT A REACTIVE MIXTURE IN A LOCATION BETWEEN OR     │
│ THAT WILL BE BETWEEN A FIRST MOLD PART AND A SECOND     │
│                   MOLD PART                      1104   │
└─────────────────────────────────────────────────────────┘
                            │
┌─────────────────────────────────────────────────────────┐
│ POSITION THE COMBINED INSERT IN CONTACT WITH THE        │
│                 REACTIVE MIXTURE                        │
│                                                  1105   │
└─────────────────────────────────────────────────────────┘
                            │
┌─────────────────────────────────────────────────────────┐
│ POSITION THE FIRST MOLD PART PROXIMATE TO THE SECOND    │
│ MOLD PART TO FORM A LENS CAVITY WITH THE REACTIVE       │
│ MONOMER MIX AND THE COMBINED INSERT IN THE              │
│                  LENS CAVITY                     1106   │
└─────────────────────────────────────────────────────────┘
                            │
┌─────────────────────────────────────────────────────────┐
│ POLYMERIZE THE REACTIVE MIXTURE TO FORM AN              │
│                 OPHTHALMIC LENS                         │
│                                                  1107   │
└─────────────────────────────────────────────────────────┘
                            │
┌─────────────────────────────────────────────────────────┐
│ REMOVE EITHER THE FRONT MOLD PART OR THE BACK MOLD      │
│ PART FROM CONTACT WITH THE OPHTHALMIC LENS       1108   │
└─────────────────────────────────────────────────────────┘
                            │
┌─────────────────────────────────────────────────────────┐
│ APPLY A COLORANT MATERIAL TO SIDE OF THE OPHTHALMIC     │
│ LENS WHERE THE MOLD PART HAS BEEN REMOVED AND           │
│ OPTIONALLY CURE THE COLORANT MATERIAL            1109   │
└─────────────────────────────────────────────────────────┘
                            │
┌─────────────────────────────────────────────────────────┐
│ REMOVE THE OPHTHALMIC LENS FROM THE REMAINING MOLD      │
│                     PART                         1110   │
└─────────────────────────────────────────────────────────┘
```

FIG. 11

```
┌─────────────────────────────────────────────────────────┐
│ FORM AN OPHTHALMIC INSERT FRONT CURVE PIECE WITH AT     │
│ LEAST A FIRST SURFACE PORTION FOR SEALING, AND          │
│ OPTIONALLY APPLY CONDUCTIVE TRACES AND ELECTRICAL       │
│ COMPONENTS                                         1201 │
└─────────────────────────────────────────────────────────┘
                             │
┌─────────────────────────────────────────────────────────┐
│ FORM AN OPHTHALMIC INSERT BACK CURVE PIECE WITH AT      │
│ LEAST A FIRST SURFACE PORTION FOR SEALING, AND          │
│ OPTIONALLY APPLY CONDUCTIVE TRACES AND ELECTRICAL       │
│ COMPONENTS                                         1202 │
└─────────────────────────────────────────────────────────┘
                             │
┌─────────────────────────────────────────────────────────┐
│ APPLY AN ADHESIVE MATERIAL TO ONE OR BOTH OF THE        │
│ FRONT CURVE PIECE AND THE BACK CURVE PIECE AND          │
│ COMBINE                                            1203 │
└─────────────────────────────────────────────────────────┘
                             │
┌─────────────────────────────────────────────────────────┐
│ DEPOSIT A REACTIVE MIXTURE IN A LOCATION BETWEEN OR     │
│ THAT WILL BE BETWEEN A FIRST MOLD PART AND A SECOND     │
│ MOLD PART                                          1204 │
└─────────────────────────────────────────────────────────┘
                             │
┌─────────────────────────────────────────────────────────┐
│ POSITION THE COMBINED INSERT IN CONTACT WITH THE        │
│ REACTIVE MIXTURE                                   1205 │
└─────────────────────────────────────────────────────────┘
                             │
┌─────────────────────────────────────────────────────────┐
│ POSITION THE FIRST MOLD PART PROXIMATE TO THE SECOND    │
│ MOLD PART TO FORM A LENS CAVITY WITH THE REACTIVE       │
│ MONOMER MIX AND THE COMBINED INSERT IN THE              │
│ LENS CAVITY                                        1206 │
└─────────────────────────────────────────────────────────┘
                             │
┌─────────────────────────────────────────────────────────┐
│ POLYMERIZE THE REACTIVE MIXTURE TO FORM AN              │
│ OPHTHALMIC LENS                                    1207 │
└─────────────────────────────────────────────────────────┘
                             │
┌─────────────────────────────────────────────────────────┐
│ REMOVE THE OPHTHALMIC LENS FROM THE MOLD PART      1208 │
└─────────────────────────────────────────────────────────┘
                             │
┌─────────────────────────────────────────────────────────┐
│ APPLY A COLORANT MATERIAL TO ONE OR BOTH OF THE FRONT   │
│ AND THE BACK OF THE OPHTHALMIC LENS AND OPTIONALLY      │
│ CURE THE COLORANT MATERIAL                         1209 │
└─────────────────────────────────────────────────────────┘
```

FIG. 12

FORM AN OPHTHALMIC INSERT FRONT CURVE PIECE WITH AT LEAST A FIRST SURFACE PORTION FOR SEALING, AND OPTIONALLY APPLY CONDUCTIVE TRACES AND ELECTRICAL COMPONENTS
1301

FORM AN OPHTHALMIC INSERT BACK CURVE PIECE WITH AT LEAST A FIRST SURFACE PORTION FOR SEALING, AND OPTIONALLY APPLY CONDUCTIVE TRACES AND ELECTRICAL COMPONENTS
1302

APPLY A COLORANT MATERIAL TO ONE OR BOTH OF THE FRONT CURVE PIECE AND THE BACK CURVE PIECE AND OPTIONALLY CURE THE COLORANT MATERIAL
1303

APPLY AN ADHESIVE MATERIAL TO ONE OR BOTH OF THE FRONT CURVE PIECE AND THE BACK CURVE PIECE AND COMBINE
1304

DEPOSIT A REACTIVE MIXTURE IN A LOCATION BETWEEN OR THAT WILL BE BETWEEN A FIRST MOLD PART AND A SECOND MOLD PART
1305

POSITION THE COMBINED INSERT WITH THE COLORANT MATERIAL IN CONTACT WITH THE REACTIVE MIXTURE
1306

POSITION THE FIRST MOLD PART PROXIMATE TO THE SECOND MOLD PART TO FORM A LENS CAVITY WITH THE REACTIVE MONOMER MIX AND THE COMBINED INSERT IN THE LENS CAVITY
1307

POLYMERIZE THE REACTIVE MIXTURE TO FORM AN OPHTHALMIC LENS
1308

REMOVE THE OPHTHALMIC LENS FROM THE MOLD PART
1309

FIG. 13

METHOD OF FORMING A PATTERNED MULTI-PIECE INSERT FOR AN OPHTHALMIC LENS

FIELD OF USE

This invention describes methods, apparatus, and devices with printed colorant patterns on ophthalmic lens device inserts. More specifically, this invention describes various methods of printing patterns on ophthalmic lens inserts in the fabrication of an ophthalmic lens device with a Multi-piece Insert.

BACKGROUND

Traditionally, an ophthalmic device, such as a contact lens, an intraocular lens, or a punctal plug included a biocompatible device with a corrective, cosmetic, or therapeutic quality. A contact lens, for example, can provide one or more of: vision correcting functionality; cosmetic enhancement; and therapeutic effects. Each function is provided by a physical characteristic of the lens. A design incorporating a refractive quality into a lens can provide a vision corrective function. A pigment incorporated into the lens can provide a cosmetic enhancement. An active agent incorporated into a lens can provide a therapeutic functionality. Such physical characteristics may be accomplished without the lens entering into an energized state.

More recently, it has been theorized that active components may be incorporated into a contact lens. Some components can include semiconductor devices. Some examples have shown semiconductor devices embedded in a contact lens placed upon animal eyes. However, such devices lack a freestanding energizing mechanism. Although wires may be run from a lens to a battery to power such semiconductor devices, and it has been theorized that the devices may be wirelessly powered, no mechanism for such wireless power has been available.

The resulting products of ophthalmic lenses containing inserts and components may produce a device that has a visual projection when worn that displays components and interconnects and various other features, which appear different from a standard look of a user's eye. It may be desirable for some users that the end ophthalmic product have printed features upon it that render an appearance that is similar to a standard look of a user's eye. Accordingly novel methods, devices, and apparatus relating to the patterning of various components in ophthalmic and biomedical devices formed with inserts are therefore important.

SUMMARY

The present invention includes innovations relating to the patterning of various components including for example inserts that can be incorporated into an ophthalmic device. Examples of such ophthalmic devices may include, for example a contact lens or a punctal plug. From a more general perspective, numerous other biomedical devices may be relevant within the scope of the invention. In addition, methods and apparatus for forming an ophthalmic lens, with a sealed or encapsulated patterned Multi-piece Insert are presented. In some embodiments, the insert is in an energized state capable of powering a component capable of drawing a current. Non-limiting examples of Components may include one or more of a variable optic lens element, a semiconductor device, and an active or passive electronic device. These components may also include the ability of being activated by an external signal of various types. Some embodiments can also include a cast molded silicone hydrogel contact lens with a rigid or formable energized insert contained within the ophthalmic lens in a biocompatible fashion where the patterning either occurs on surfaces of the insert or at or near the surface of the ophthalmic device itself.

In some embodiments, methods of forming a patterned Multi-piece Insert for an ophthalmic lens are disclosed. In some embodiments, the method includes forming a first insert back curve piece; forming a first insert front curve piece; depositing a conductive material onto one or both of the first insert front cover piece and first insert back curve piece; attaching an electronic component to one or both of the first insert front and first insert back curve pieces, wherein the attachment is made to the conductive material; placing a first material to form a first seal upon a surface of one, or both of, the first insert front cover piece and first insert back curve piece; combining the first insert back curve piece with the first insert front curve piece to form a first ophthalmic insert; and applying a colorant to at least one surface upon either or both of the first insert back curve piece and the first insert front curve piece.

In some embodiments, the method further includes forming at least a second insert back curve piece; placing a second material to form a second seal, wherein the second seal is upon one or both of the first insert front cover piece and second insert back curve piece; combining the first ophthalmic insert with the second insert back curve piece to form a second ophthalmic insert, wherein the second ophthalmic insert replaces the first ophthalmic insert.

In some embodiments, the colorant is applied to at least one surface upon either or both of the first insert back curve piece and the first insert front curve piece after the combining of the first insert back curve piece with the first insert front curve piece to form a first ophthalmic insert. In some other embodiments, the method includes the step of curing the colorant.

In some embodiments, the colorant is applied to at least one surface upon one or both of the first insert back curve piece and the first insert front curve piece before the combining of the first insert back curve piece with the first insert front curve piece to form a first ophthalmic insert. In some other embodiments, the method includes the step of curing the colorant. In some other embodiments, the applying of a colorant is performed utilizing a pad printing process.

In some embodiments, the applying of a colorant is performed utilizing an ink jet printing process. In some embodiments, the applying of a colorant is performed utilizing a screen printing process. In some other embodiments, the applying of a colorant is performed utilizing a lithographic imaging process.

In some embodiments, methods of forming a patterned ophthalmic lens are disclosed. In some embodiments, the methods include forming at least a first insert back curve piece; forming at least a first insert front curve piece; depositing a conductive material onto one or both of the first insert front curve piece and the first insert back curve piece; attaching an electronic component to one or both of the first insert front curve piece and the first insert back curve piece, wherein the attachment is made to the conductive material; placing a first material to form a first seal upon a surface of one or both of the first insert front curve piece and first insert back curve piece; combining the first insert back curve piece with the first insert front curve piece to form a first ophthalmic insert, depositing a reactive mixture on a surface that is upon a first mold part; positioning the first ophthalmic insert in contact with the reactive mixture; positioning a second mold part proximate to the first mold part to form a lens cavity, wherein the reactive mixture and the first ophthalmic insert are located within the cavity; polymerizing the reactive mixture to form an ophthalmic lens; removing the ophthalmic lens from the mold parts; and applying a colorant to at least one surface upon the ophthalmic lens.

In some other embodiments, the method further includes forming at least a second insert back curve piece; placing a second material to form a second seal upon one or both of the first insert front curve piece and the second insert back curve piece; combining the first ophthalmic insert with the second insert back curve piece to form a second ophthalmic insert, wherein the second ophthalmic insert then replaces the first ophthalmic insert in subsequent steps.

In some embodiments, the colorant is applied to at least one surface upon the ophthalmic lens after the ophthalmic lens is removed from both mold parts. In some embodiments, the applying of a colorant is performed utilizing a screen printing process. In some other embodiments, the applying of a colorant is performed utilizing a lithographic imaging process.

In some other embodiments, the first ophthalmic insert piece includes a liquid meniscus lens. In some other embodiments, the method further includes applying a coating over the first ophthalmic insert and pattern, wherein the coating comprises a more consistent adhesion property than the insert and pattern without the coating. In some embodiments, the coating includes paralene.

DESCRIPTION OF THE DRAWINGS

FIG. 5 illustrates the appearance of a patterned ophthalmic lens where the patterning resembles a limbal ring pattern from both a frontal and cross section perspective.

FIG. 6 illustrates the appearance of a patterned ophthalmic lens where the patterning resembles an iris pattern from both a frontal and cross section perspective.

FIG. 10 illustrates a processing flow in an exemplary method to form patterned ophthalmic lenses.

FIG. 11 illustrates an additional processing flow in an exemplary method to form patterned ophthalmic lenses.

FIG. 12 illustrates an additional processing flow in an exemplary method to form patterned ophthalmic lenses.

FIG. 13 illustrates an additional processing flow in an exemplary method to form patterned ophthalmic lenses.

DETAILED DESCRIPTION OF THE INVENTION

Figure 1:
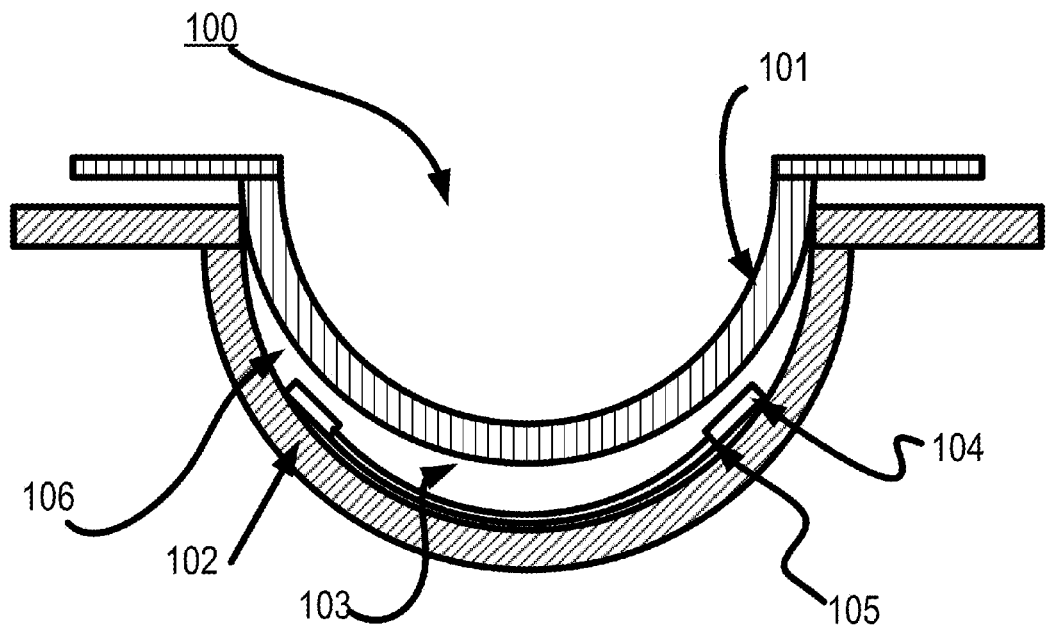
FIG. 1 illustrates a mold assembly apparatus according to some embodiments of the present invention.

The present invention includes methods and apparatus for manufacturing an ophthalmic lens with a Multi-piece Insert where portions of the Insert or an ophthalmic lens formed from an Insert may include aspects of patterning. In addition, the present invention includes an ophthalmic lens with a Multi-piece Insert incorporated into the ophthalmic lens including the aspects of patterning.

According to the present invention, an ophthalmic lens device is formed with an embedded Insert that in some cases includes an Energy Source, such as an electrochemical cell or battery as the storage means for the energy. In some embodiments, a formed ophthalmic lens may be patterned in numerous ways including, but not limiting to, printing of patterns upon a fully formed ophthalmic lens device, upon a partially formed ophthalmic device, or upon surface portions of an Insert that is subsequently formed into an ophthalmic lens device.

In some embodiments, a Multi-piece Insert also includes a pattern of circuitry, components, and Energy Sources. Various embodiments can include the Multi-piece Insert locating the pattern of circuitry, components, and Energy Sources around a periphery of an optic zone through which a wearer of a lens would see. In some embodiments, the Multi-piece Insert may include a pattern of circuitry, Components and Energy Sources, which are potentially small enough to not adversely affect the sight of a contact lens wearer. In some embodiments, the Components and the Energy Source are located within, or exterior to, an optical zone. In some embodiments, the patterned formed by these various components within, attached to, or upon the Insert may create a need for a pattern to be placed in such a manner to conceal or obstruct the pattern formed by the components.

In some embodiments of the present invention, a Multi-piece Insert is embodied within an ophthalmic lens via automation that places an Energy Source in a desired location relative to a mold part used to fashion the lens. The embodiments that place the various Components into the ophthalmic lens may employ one or more steps where Components are sealed and adhered into place or Components are encapsulated.

In some embodiments, an Energy Source is placed in electrical communication with a Component that can be activated on command and draws electrical current from the Energy Source included within the ophthalmic lens. In some embodiments, a component can include, but is not limited to, a semiconductor device, an active or passive electrical device, or an electrically activated machine. In some embodiments, an electrically activated machine may include, but is not limited to, Microelectromechanical systems (MEMS), nano-electromechanical systems (NEMS), or micromachines. In some embodiments, subsequent to placing the Energy Source and component, a Reactive Mixture can be shaped by the mold part and polymerized to form the ophthalmic lens.

In the following sections detailed descriptions of embodiments of the invention will be given. The description of both preferred and alternative embodiments are exemplary embodiments only, and it is understood that to those skilled in the art that variations, modifications and alterations may be apparent. It is therefore to be understood that said exemplary embodiments do not limit the scope of the underlying invention.

GLOSSARY

In this description and claims directed to the presented invention, various terms may be used for which the following definitions will apply:

Back Curve Piece: as used herein (and sometimes as an Insert back curve) refers to a solid element of a Multi-piece Insert which when assembled into the said Insert will occupy a location on the side of the lens that is on the back. In an ophthalmic device, such a piece would be located on the side of the Insert that would be closer to the user's eye surface. In some embodiments, the back curve piece may contain and include a region in the center of an ophthalmic device through which light may proceed into the user's eye or an optic zone. In some embodiments, the piece may take an annular shape where it does not contain or include some or all of the regions in an optic zone. In some embodiments, there may be multiple back curve pieces of an Insert where one of the Inserts may include the optic zone, while others may be annular or portions of an annulus.

Component: as used herein refers to a device capable of drawing electrical current from an Energy Source to perform one or more of a change of logical state or physical state.

Encapsulate: as used herein refers to creating a barrier to separate an entity, such as, for example, a Media Insert, from an environment adjacent to the entity.

Encapsulant: as used herein refers to a layer formed surrounding an entity, such as, for example, a Media Insert, that creates a barrier to separate the entity from an environment adjacent to the entity. For example, Encapsulants may be comprised of silicone hydrogels, such as Etafilcon, Galyfilcon, Narafilcon, and Senofilcon, or other hydrogel contact lens material. In some embodiments, an Encapsulant may be semipermeable to contain specified substances within the entity and prevent specified substances, such as, for example, water, from entering the entity.

Energized: as used herein refers to the state of being able to supply electrical current to or to have electrical energy stored within.

Energy: as used herein refers to the capacity of a physical system to do work. Many uses within this invention may relate to the said capacity being able to perform electrical actions in doing work.

Energy Source: as used herein refers to device capable of supplying Energy or placing a biomedical device in an Energized state.

Energy Harvesters: as used herein refers to device capable of extracting energy from the environment and convert it to electrical energy.

Front Curve Piece: as used herein (and sometimes as an Insert front curve) refers to a solid element of a Multi-piece Insert which when assembled into the said Insert will occupy a location on the side of the lens that is on the front. In an ophthalmic device, such a piece would be located on the side of the Insert that would be further from the user's eye surface. In some embodiments, the piece may contain and include a region in the center of an ophthalmic device through which light may proceed into the user's eye or an optic zone. In other embodiments, the piece may be annular in shape where it does not contain or include some or all of the regions in an optic zone. In some embodiments, an ophthalmic Insert, may include multiple front curve pieces where one of the pieces may include the optic zone, while others may be annular or portions of an annulus.

Lens forming mixture or "Reactive Mixture" or "RMM" (reactive monomer mixture): as used herein refers to a monomer or prepolymer material that can be cured, crosslinked; or crosslinked to form an ophthalmic lens. Various embodiments can include lens-forming mixtures with one or more additives such as, but not limited to, UV blockers, tints, photoinitiators, or catalysts, and other suitable in an ophthalmic lenses, contact lenses, or intraocular lenses.

Lens Forming Surface: refers to a surface that is used to mold a lens. In some embodiments, any such surface can have an optical quality surface finish, which indicates that it is sufficiently smooth and formed so that a lens surface fashioned by the polymerization of a lens forming material in contact with the molding surface is optically acceptable. Further, in some embodiments, the lens-forming surface can have a geometry that is necessary to impart to the lens surface the desired optical characteristics, including without limitation, spherical, aspherical and cylinder power, wave front aberration correction, corneal topography correction and the like as well as any combinations thereof.

Lithium Ion Cell: as used herein refers to an electrochemical cell where Lithium ions move through the cell to generate electrical energy. This electrochemical cell, typically called a battery, may be reenergized, or recharged in its typical forms.

Multi-piece Insert: as used herein refers to a formable or rigid substrate capable of supporting an Energy Source within an ophthalmic lens. In some embodiments, the Multi-piece Insert also supports one or more components.

Mold: as used herein refers to a rigid or semi-rigid object that may be used to form lenses from uncured formulations. Some preferred molds include two mold parts forming a front curve mold part and a back curve mold part.

Ophthalmic Lens: as used herein refers to any ophthalmic device that resides in or on the eye. These devices can provide optical correction or may be cosmetic. For example, the term lens can refer to a contact lens, intraocular lens, overlay lens, ocular Insert, optical Insert or other similar device through which vision is corrected or modified, or through which eye physiology is cosmetically enhanced (e.g. iris color) without impeding vision. In some embodiments, the preferred lenses of the invention are soft contact lenses made from silicone elastomers or hydrogels.

Optical Zone: as used herein refers to an area of an Ophthalmic Lens through which a wearer of the Ophthalmic Lens sees.

Power: as used herein refers to work done or energy transferred per unit of time.

Rechargeable or Re-energizable: as used herein refers to a capability of being restored to a state with higher capacity to do work. Many uses within this invention may relate to the capability of being restored with the ability to flow electrical current at a certain rate for certain, reestablished time period.

Reenergize or Recharge: as used herein refers to restore to a state with higher capacity to do work. Many uses within this invention may relate to restoring a device to the capability to flow electrical current at a certain rate for certain, reestablished time period.

Released from a mold: as used herein means that a lens is either completely separated from the mold, or is only loosely attached so that it can be removed with mild agitation or pushed off with a swab.

Stacked Integrated Component Devices: as used herein and sometimes referred to as "SIC-Devices," refers to the product of packaging technologies that can assemble thin layers of substrates, which may contain electrical and electromechanical devices, into operative integrated devices by means of stacking at least a portion of each layer upon each other. In some embodiments, the layers may comprise component devices of various types, materials, shapes, and sizes. Furthermore, the layers may be made of various device production technologies to fit and assume various contours, as it may be desired.

Proceeding to FIG. 1, an apparatus 100 to form patterned ophthalmic devices containing sealed and encapsulated Inserts is depicted. The apparatus 100 includes an exemplary front curve mold 102 and a matching back curve mold 101. In some embodiments, an insert 104 and a body of the Ophthalmic Lens device 103 may be found inside these two molds 101 and 102. In some embodiments, body of Ophthalmic Lens device 103 may be a hydrogel material and the Insert 104 may be surrounded on all surfaces by this material.

The Insert 104 may be one of many different types of Inserts. In the depiction of FIG. 1, there may be at least one patterned surface 105 in the Insert 104. There may be many different manners to pattern either the Insert 104 or the body of the Ophthalmic Lens device 103 which form the patterning surface 105. In some embodiments, the apparatus 100 may create a novel ophthalmic device made up of a combination of components with numerous sealed regions.

Referring back to FIG. 1, a diagram of an exemplary mold device 100 for an Ophthalmic Lens is illustrated with a Multi-piece Insert 104. As used herein, a mold device 100 includes a plastic formed to shape a cavity 106 into which a lens-forming mixture can be dispensed such that upon reaction or cure of the lens forming mixture, an Ophthalmic Lens of a desired shape is produced. In some embodiments, the molds and mold device 100 are made up of more than one "mold parts" or "mold pieces" 101-102. The mold parts 101-102 can be brought together such that a cavity 105 is formed between the molds parts 101-102 in which a lens can be formed. This combination of mold parts 101-102 is preferably temporary. Upon formation of the Ophthalmic Lens device, the mold parts 101-102 can again be separated for removal of the lens.

In some embodiments, at least one mold part 101-102 has a portion of its surface in contact with the lens forming mixture such that upon reaction or cure of the lens forming mixture that surface provides a desired shape and form to the portion of the lens with which it is in contact. The same is true of other mold part 101-102.

In some embodiments, a mold device 100 is formed from two parts 101-102, a female concave piece (front piece) 102 and a male convex piece (back piece) 101 with a cavity 106 in between them. The portion of the concave surface which makes contact with a lens-forming mixture has the curvature of the front curve of an Ophthalmic Lens to be produced in the mold device 100, and is sufficiently smooth and formed such that the surface of an Ophthalmic Lens, formed by polymerization of the lens forming mixture—which is in contact with the concave surface—is optically acceptable.

In some embodiments, the front mold piece 102 can also have an annular flange integral with, and surrounding a circumferential edge of the Ophthalmic Lens device. In some embodiments, a lens-forming surface can include a surface with an optical quality surface finish, which indicates that it is sufficiently smooth and formed so that a lens surface fashioned by the polymerization of a lens forming material in contact with the molding surface is optically acceptable. Further, in some embodiments, the lens forming surfaces of mold pieces 101-102 can have a geometry that is necessary to impart to the lens surface the desired optical characteristics, including without limitation, spherical, aspherical and cylinder power, wave front aberration correction, corneal topography correction and the like as well as any combinations thereof.

In some embodiments, a Multi-piece Insert 104 is illustrated onto which an Energy Source and a Component are mounted. The Multi-piece Insert 104 may be any receiving material onto which an Energy Source may be placed, and in some embodiments may include circuit paths, components and other aspects useful to place the Energy Source in electrical communication with the Component and enable the Component to draw an electrical current from the Energy Source. In some embodiments, sealing and encapsulating 105 allow a functional Insert to be manufactured in multiple pieces and then reliably assembled and sealed for eventual inclusion into an ophthalmic device, where materials in the ambient of the ophthalmic device and materials inside the Insert device cannot diffuse through the Insert materials or seals 105.

Various embodiments also include placing an Energy Source into a Multi-piece Insert 104 prior to placement of the Multi-piece Insert 104 into a mold portion used to form a lens. The Multi-piece Insert 104 may also include one or more components that will receive an electrical charge via the Energy Source.

In some embodiments, a lens with a Multi-piece Insert 104 can include a rigid center and a soft skirt design in which a central rigid optical element is in direct contact with the atmosphere and the corneal surface on respective an anterior and posterior surfaces. Furthermore, a soft skirt of lens material (typically made of hydrogel material) is attached to a periphery of the rigid optical element. In some embodiments, the rigid optical element also acts as a Multi-piece Insert providing energy and functionality to the resulting Ophthalmic Lens.

Some additional embodiments include a Multi-piece Insert 104 that is a rigid lens Insert fully encapsulated within a hydrogel matrix. A Multi-piece Insert 104 that is a rigid lens Insert may be manufactured, for example, by using microinjection-molding technology. Embodiments can include, for example, a poly (4-methylpent-1-ene copolymer resin with a diameter of between about 6 mm to 10 mm, a front surface radius of between about 6 mm and 10 mm, a rear surface radius of between about 6 mm and 10 mm, and a center thickness of between about 0.050 mm and 0.5 mm. Some exemplary embodiments include an Insert with diameter of about 8.9 mm, a front surface radius of about 7.9 mm, a rear surface radius of about 7, 8 mm, a center thickness of about 0.100 mm, and an edge profile of about 0.050 radius. One exemplary micromolding machine can include the Microsystem 50 five-ton system offered by Battenfield Inc. Some or all of the sealing features, including grooves, slots, lips, knife-edges and the like may be formed during the molding process or later formed by subsequent processing of the molding process.

In some embodiments, a Multi-piece Insert can be placed in mold parts 101-102 utilized to form an Ophthalmic Lens device. In some embodiments, Mold part 101-102 material can include, for example: a polyolefin of one or more of: polypropylene, polystyrene, polyethylene, polymethyl methacrylate, and modified polyolefins. Other molds can include a ceramic or metallic material.

In some embodiments, other mold materials that may be combined with one or more additives to form an Ophthalmic Lens mold include, for example, Zieglar-Natta polypropylene resins (sometimes referred to as znPP); a clarified random copolymer for clean molding as per FDA regulation 21 CFR (c) 3.2; a random copolymer (znPP) with ethylene group.

In some embodiments, mold parts 101-102 may contain polymers such as polypropylene, polyethylene, polystyrene, polymethyl methacrylate, modified polyolefins containing an alicyclic moiety in the main chain, and cyclic polyolefins. This blend can be used on either or both mold parts 101-102. In some embodiments, this blend is used on the back mold part 101 and the front mold part 102; and includes alicyclic co-polymers.

In some embodiments, injection molding is utilized according to known techniques, however, embodiments can also include molds fashioned by other techniques including, for example: lathing, diamond turning, or laser cutting.

In some other embodiments, Ophthalmic Lens devices are formed on at least one surface of both mold parts 101-102. However, in some embodiments, one surface of a lens may be formed from a mold part 101-102 and another surface of a lens can be formed using a lathing method, or any other methods.

Figure 2:
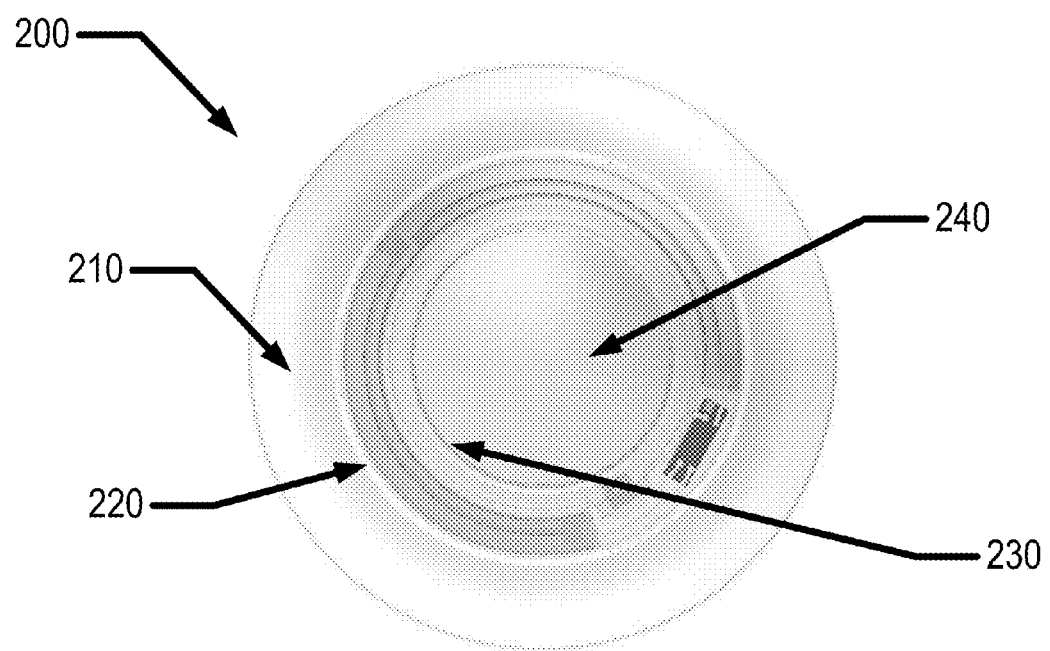
FIG. 2 illustrates an energized ophthalmic lens with a sealed insert embodiment.

Proceeding to FIG. 2, an example of an unpatterned Ophthalmic Lens device 200 with embedded Insert is depicted in cross section. In some embodiments, a surrounding ophthalmic device shell 210 may be formed by the molding features of FIG. 1, and may be made of numerous materials including hydrogel compounds.

Additionally, the Ophthalmic Lens device 200 may include an Insert 220. In some embodiments, the Insert 220 may be made of multiple pieces and have various kinds of seals utilized to complete the Insert 220.

In some embodiments, the Ophthalmic Lens device 200 may also include a component device layer 230 that may include, but not limited to, activation elements, processing elements, energization elements, and sensing elements. In some embodiments, there may be numerous encapsulation schemes that are relevant to the inclusion of such a layer. In addition, in some embodiments, the layers 210 may be adhered to other components 240 such as an active optical device before the resulting Insert is fixed into an ophthalmic device, as is shown in FIG. 1.

Referring back to FIG. 2, an unpatterned version of a formed ophthalmic device and incorporation of various components is illustrated.

Figure 3:
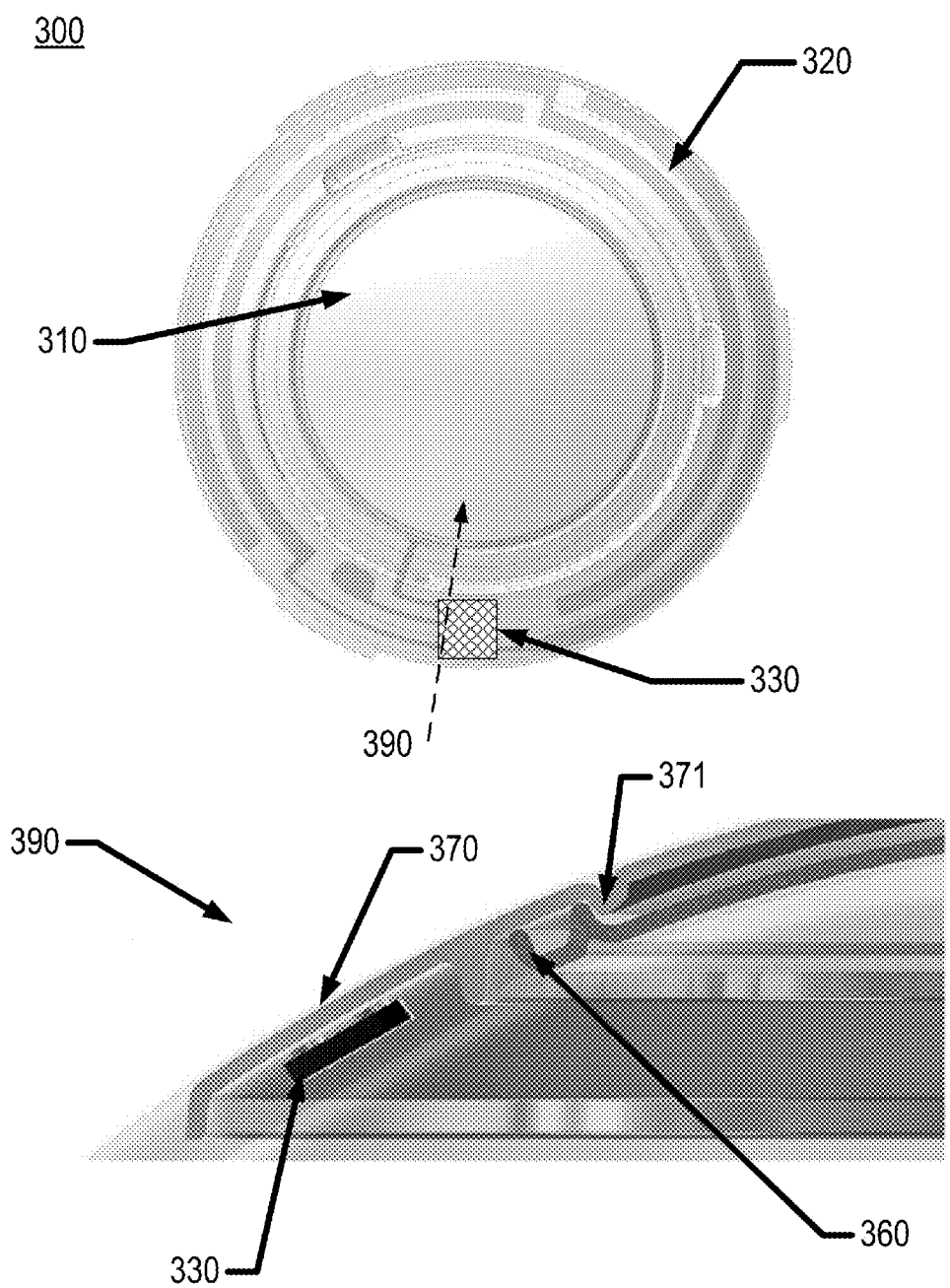
FIG. 3 illustrates an energized ophthalmic lens with a sealed annular shaped insert embodiment.

Proceeding to FIG. 3, a close up cross section 300 of the edge of an exemplary ophthalmic device is shown. In some embodiments, a top view 390 of the cross section 300 is demonstrated. In some embodiments, the ophthalmic device may be considered full, because in optic zone 310 there may be an Insert or other active components of various kinds. For example, in a meniscus type lens, the region defined by optic zone 310 may be surrounded by two immiscible fluids that form the basis of a meniscus type active lens. In some embodiments, optic zone 310 may represent the front surface of the Insert, and may be a molded separate piece onto which various conductive electrode metal layers may have been deposited. In some embodiments, various electrical components 330 and electrical traces with energization elements 320 are present.

In some embodiments, the molded front piece may have a recess 371 molded into it, which will then intersect with the molded, but separate, back piece 360 as shown. In some embodiments, recess 371 may be called a glue groove. In some other embodiments, when front piece and back piece are brought into proximity of each other—whether before or after the fluids are filled into a cavity that is formed by the two pieces—the back piece may be advanced to firmly register into the groove 371. Thereafter, an adhesive or sealant may be deposited into the remaining space of the groove 371. In some embodiments, groove 371 may be located around the entire periphery of the Ophthalmic Lens device itself. In some embodiments, surface 370 may presents an exemplary location where patterns may be placed to create a patterned Insert formed by patterning of the Insert itself. In some other embodiments, other surfaces may be patterned and formed. In addition, in some embodiments encapsulants 331 may define surfaces that may be patterned. In many embodiments, nevertheless, the front facing surface 370 may still be patterned along with any patterning on back curve surfaces 360 or surfaces located on the back curve side.

Figure 4:
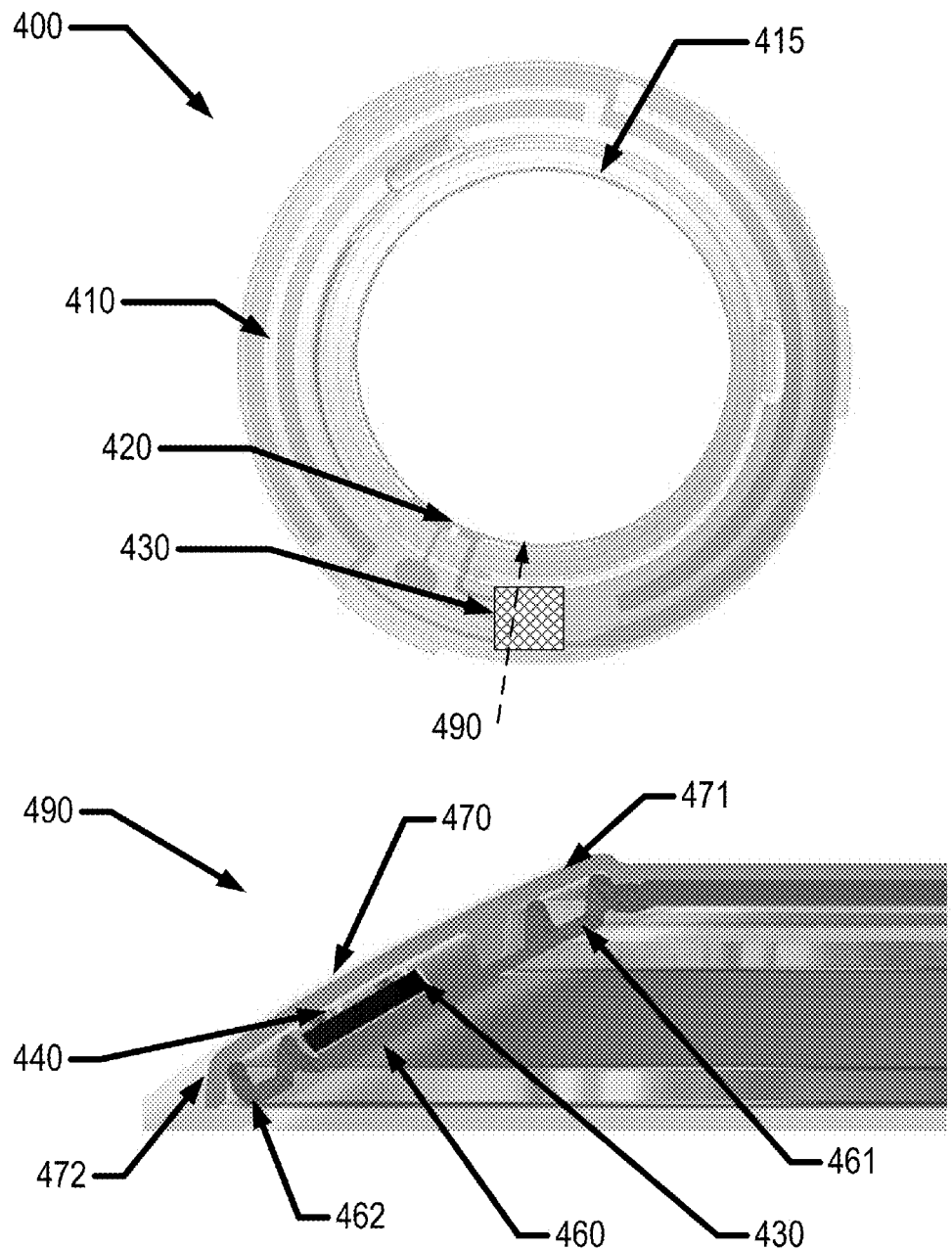
FIG. 4 illustrates the appearance of a non-patterned ophthalmic lens insert from a frontal perspective.

In some other embodiments, an Insert is not a full device as mentioned above, but rather is an annular device where at least a portion of the central portion may be devoid of material. Proceeding to FIG. 4, an illustration of such an annular Insert type 400 may be found. The annular Insert 400 may have a front curve piece 410 that may have a front facing surface 470. In some embodiments, an inner edge 415 defines the inner feature of the annular Insert 400.

In some embodiments, a cross sectional 490 of the annular Insert 400 is disclosed. In the cross section 490, the front curve piece with surface 470 may extend from molded edges 471 and 472 on the two extremes of the annulus. In some embodiments, there may be a back curve piece 460 that covers and encapsulates a region between the front and back curve pieces. The back curve piece 460 may have an extent that ranges from molded features at 461 and 462. In some other embodiments, back cure piece 460 may provide additional surfaces upon which patterning features may be formed.

In some embodiments, annular Insert 400 may contain numerous components. In a non-limiting exemplary sense, the Insert 400 may contain electronic devices 430. In some embodiments, electronic devices 430 may be electrically connected by connection features such as solder balls 440, and sensing elements 420. In some embodiments, electrical traces may be present within the cavity defined by pieces 470 and 460 as well as energization elements. As with the full device of item 300, the presence of these numerous components and devices may give an annular device an appearance that would be similar to that shown in FIG. 2 if there were no patterning performed on at least some of the various surfaces.

In some embodiments, a Multi-Piece Insert 400 may have an Optic Zone 415 that includes a variable optic powered by an Energy Source 430 located on the Multi-Piece Insert 400. The Multi-Piece Insert 400 can also include circuitry 425 to control the variable optic included in the optic zone 415. In some embodiments, a variable optic can be considered a Component.

In some embodiments, an Energy Source 430 can be in electrical communication with a Component. The Component can include any device, which responds to an electrical charge with a change in state, such as, for example: a semiconductor type chip; a passive electrical device; or an optical device such as a crystal lens.

In some specific embodiments, an Energy Source 430 includes, for example: battery or other electrochemical cell; capacitor; ultracapacitor; supercapacitor; or other storage Component. Some specific embodiments can include a battery located on a Multi-Piece Insert 400 on the periphery of an Ophthalmic Lens outside of the optic zone 415.

Proceeding to FIG. 5, appearance of an exemplary patterned Ophthalmic Lens device 500 may be observed. The type of pattern displayed in the Ophthalmic Lens device 500 may be considered a limbic ring pattern. In some embodiments, a hydrogel 510 may represent an encapsulating layer for an Insert. In some embodiments, the printed pattern may completely cover the Insert from the dense limbic ring 520 to the other side 530. In some embodiments, internal regions 540 of the Ophthalmic Lens device 500 may locate an active optical device in the optic zone. In some other embodiments, the internal region 540 may be made of hydrogel material alone if the Insert is of annular shape.

Referring back to FIG. 5, in the cross section below, the nature of the pattern and its ability to cover the material underneath it may be illustrated. Once again, the pattern represents a limbic ring pattern and is printed from region 520 to region 530. Numerous components and features may be located under the pattern including, but not limiting to, integrated circuits 590, and electrical interconnects 570.

In some embodiments, the pattern may be placed onto a surface of the front curve section of the Insert device before it was assembled into the Ophthalmic Lens. In other embodiments, the pattern may be placed onto the body of the Ophthalmic Lens device. In other embodiments, the pattern may be placed beneath the surface of the Ophthalmic Lens device by an injection process, or alternatively by a multilayered process of forming the body of the Ophthalmic Lens device.

The nature of the pattern may represent a diversity of embodiments. In some embodiments, the pattern may be attached to one or more items included in an insert device, for example, on a surface of a front curve piece of an insert device. In other embodiments, the pattern may be placed onto the body of the Ophthalmic Lens itself. In still other embodiments, the pattern may be placed beneath the surface of the Ophthalmic Lens by an injection process, or alternatively, by a multilayered process of forming the body of the Ophthalmic Lens.

In some embodiments, a coating may be applied to the pattern and the Insert to promote consistent adhesion properties between the Insert device with pattern and a hydrogel portion of an Ophthalmic Lens. In some embodiments, the coating may, for example, include paralene.

Proceeding to FIG. 6, a different type for a patterned ophthalmic lens device 600 is depicted. In some embodiments, the pattern that is printed may represent an iris type pattern. In some embodiments, the color of the pattern may assume a wide variety of choices ranging from natural pigmentation types of color to other colors. The patterned lens may have similar defined regions such as, a central optic zone 640, or a patterned region from an interior ring 630 to an exterior ring 620. In some embodiments, an Insert may be encapsulated by Ophthalmic Lens materials such as hydrogel. In some other embodiments, skirt 610 that surrounds the Insert and defines the external shape of the Ophthalmic Lens device 600 is present.

Referring back to FIG. 6, in a cross section, the patterned region between item 620 and 630 is demonstrated. As discussed in FIG. 5, the patterned region may cover or obscure underlying components. In some embodiments, the patterned region may further include features such as integrated circuits 690, and electrical interconnects 670. In some other embodiments, numerous other features and components may lie under the patterned region within the Ophthalmic Lens device 600.

In some embodiments, a region of transparent patterning or non-patterning 625 is located within the pattern design. As a non-limiting example, an integrated circuit 690 is depicted. In an exemplary embodiment, the integrated circuit 690 may include functional elements to allow it to detect changes in ambient light in the integrated circuit's environment, which may occur when a user blinks. There may be numerous reasons that detecting such a blink may be useful, including, for example, the use of blinking to control or signal the desire to change a state in the Ophthalmic Lens. In such an embodiment, it may be desirable for any patterns on the lens to have a window 625 that allows light to pass through the patterned region and into an underlying detector 690. The window 625 may be made by the lack of pattern-forming material, or by an alternative material, which is transparent to light of certain wavelengths that the detector may detect. In some embodiments, the presence of light on the integrated circuit 690, except in regions meant for detection, may have adverse effects on the performance of the Ophthalmic Lens device 600. Therefore, in addition to aesthetic purposes of patterning the lens, functional motivations such as the exclusion of light from circuit elements, extending the life of energization elements, may also be relevant.

In some other embodiments, various types of patterning that would conceal components and features from visual recognition are disclosed. In some embodiments, a vast array of possible pattern designs is consistent with the inventive art that has been designed. As a non-limiting example, a design approach based on principles of camouflage may be employed where instead of blocking the appearance of underlying features the printed pattern renders them less recognizable. There may be many patterns that may be employed when patterning ophthalmic devices with Inserts.

In some embodiments, an Ophthalmic Lens type can include a lens that includes a silicone-containing component. A "silicone-containing component" is one that contains at least one [—Si—O—] unit in a monomer, macromer, or prepolymer. Preferably, the total Si and attached O are present in the silicone-containing component in an amount greater than about 20 weight percent, and more preferably greater than 30 weight percent of the total molecular weight of the silicone-containing component. Useful silicone-containing components preferably comprise polymerizable functional groups, such as, but not limited to, acrylate, methacrylate, acrylamide, methacrylamide, vinyl, N-vinyl lactam, N-vinylamide, and styryl functional groups.

In some embodiments, the Ophthalmic Lens skirt or an Insert, that surrounds the Insert, may be comprised of standard hydrogel lens formulations. Exemplary materials with characteristics that may provide an acceptable match to numerous Insert materials may include the Narafilcon family; including Narafilcon A and Narafilcon B. Alternatively, the Etafilcon family; including Etafilcon A may represent good exemplary material choices. In some embodiments, any material which may form an acceptable enclosure or partial enclosure of the sealed and encapsulated Inserts may be included.

In some embodiments, suitable silicone containing components include compounds of Formula I

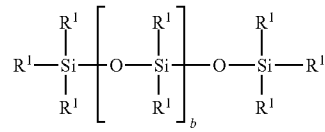

where:

$R^1$ is independently selected from monovalent reactive groups, monovalent alkyl groups, or monovalent aryl groups, any of the foregoing which may further comprise functionality selected from hydroxy, amino, oxa, carboxy, alkyl carboxy, alkoxy, amido, carbamate, carbonate, halogen or combinations thereof; and monovalent siloxane chains comprising 1-100 Si—O repeat units which may further comprise functionality selected from alkyl, hydroxy, amino, oxa, carboxy, alkyl carboxy, alkoxy, amido, carbamate, halogen or combinations thereof;

where b=0 to 500, where it is understood that when b is other than 0, b is a distribution having a mode equal to a stated value;

wherein at least one $R^1$ comprises a monovalent reactive group, and in some embodiments between one and 3 $R^1$ comprise monovalent reactive groups.

As used herein "monovalent reactive groups" are groups that can undergo free radical and/or cationic polymerization.

Non-limiting examples of free radical reactive groups include (meth)acrylates, styryls, vinyls, vinyl ethers, $C_{1-6}$alkyl(meth)acrylates, (meth)acrylamides, $C_{1-6}$alkyl(meth)acrylamides, N-vinyllactams, N-vinylamides, $C_{2-12}$alkenyls, $C_{2-12}$alkenylphenyls, $C_{2-12}$alkenylnaphthyls, $C_{2-6}$alkenylphenylC$_{1-6}$alkyls, O-vinylcarbamates and O-vinylcarbonates. Non-limiting examples of cationic reactive groups include vinyl ethers or epoxide groups and mixtures thereof. In one embodiment the free radical reactive groups comprises (meth)acrylate, acryloxy, (meth)acrylamide, and mixtures thereof.

In some embodiments, suitable monovalent alkyl and aryl groups include unsubstituted monovalent $C_1$ to $C_{16}$alkyl groups, $C_6$-$C_{14}$ aryl groups, such as substituted and unsubstituted methyl, ethyl, propyl, butyl, 2-hydroxypropyl, propoxypropyl, polyethyleneoxypropyl, combinations thereof, and the like.

In some embodiments, b is zero, one $R^1$ is a monovalent reactive group, and at least three $R^1$ are selected from monovalent alkyl groups having one to 16 carbon atoms, and in another embodiment from monovalent alkyl groups having one to 6 carbon atoms. Non-limiting examples of silicone components of this embodiment include 2-methyl-, 2-hydroxy-3-[3-[1,3,3,3-tetramethyl-1-[(trimethylsilyl)oxy]disiloxanyl]propoxy]propyl ester ("SiGMA"), 2-hydroxy-3-methacryloxypropyloxypropyl-tris(trimethylsiloxy)silane, 3-methacryloxypropyltris(trimethylsiloxy)silane ("TRIS"), 3-methacryloxypropylbis(trimethylsiloxy)methylsilane and 3-methacryloxypropylpentamethyl disiloxane.

In some embodiments, b is 2 to 20, 3 to 15 or in some embodiments 3 to 10; at least one terminal $R^1$ comprises a monovalent reactive group and the remaining $R^1$ are selected from monovalent alkyl groups having 1 to 16 carbon atoms, and in another embodiment from monovalent alkyl groups having 1 to 6 carbon atoms. In yet another embodiment, b is 3 to 15, one terminal $R^1$ comprises a monovalent reactive group, the other terminal $R^1$ comprises a monovalent alkyl group having 1 to 6 carbon atoms and the remaining $R^1$ comprise monovalent alkyl group having 1 to 3 carbon atoms. Non-limiting examples of silicone components of this embodiment include (mono-(2-hydroxy-3-methacryloxypropyl)-propyl ether terminated polydimethylsiloxane (400-1000 MW)) ("OH-mPDMS"), monomethacryloxypropyl terminated mono-n-butyl terminated polydimethylsiloxanes (800-1000 MW), ("mPDMS").

In other embodiments, b is 5 to 400 or from 10 to 300, both terminals $R^1$ comprise monovalent reactive groups and the remaining $R^1$ are independently selected from monovalent alkyl groups having 1 to 18 carbon atoms that may have ether linkages between carbon atoms and may further comprise halogen.

In some embodiments, where a silicone hydrogel lens is desired, the lens of the present invention will be made from a reactive mixture comprising at least about 20 and preferably between about 20 and 70% wt silicone containing components based on total weight of reactive monomer components from which the polymer is made.

In some other embodiments, one to four $R^1$ comprises a vinyl carbonate or carbamate of the formula:

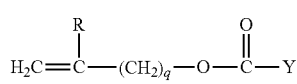

Formula II wherein: Y denotes —O—, —S— or —NH—;

R denotes, hydrogen or methyl; d is 1, 2, 3 or 4; and q is 0 or 1.

In some embodiments, the silicone-containing vinyl carbonate or vinyl carbamate monomers specifically include: 1,3-bis[4-(vinyloxycarbonyloxy)but-1-yl]tetramethyl-disiloxane; 3-(vinyloxycarbonylthio)propyl-[tris(trimethylsiloxy)silane]; 3-[tris(trimethylsiloxy)silyl]propyl allyl carbamate; 3-[tris(trimethylsiloxy)silyl]propyl vinyl carbamate; trimethylsilylethyl vinyl carbonate; trimethylsilylmethyl vinyl carbonate, and

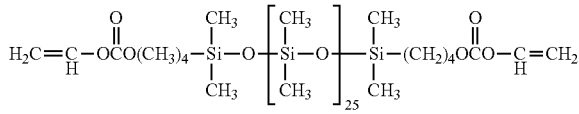

Where biomedical devices with modulus below about 200 are desired, only one $R^1$ shall comprise a monovalent reactive group and no more than two of the remaining $R^1$ groups will comprise monovalent siloxane groups.

Another class of silicone-containing components includes polyurethane macromers of the following formulae:

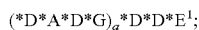

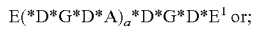

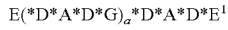 Formulae IV-VI wherein:
D denotes an alkyl diradical, an alkyl cycloalkyl diradical, a cycloalkyl diradical, an aryl diradical or an alkylaryl diradical having 6 to 30 carbon atoms, G denotes an alkyl diradical, a cycloalkyl diradical, an alkyl cycloalkyl diradical, an aryl diradical or an alkylaryl diradical having 1 to 40 carbon atoms and which may contain ether, thio or amine linkages in the main chain:
* denotes a urethane or ureido linkage;
$a$ is at least 1;
A denotes a divalent polymeric radical of formula:

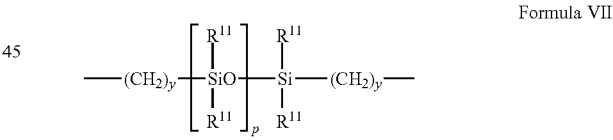

Formula VII $R^{11}$ independently denotes an alkyl or fluoro-substituted alkyl group having 1 to 10 carbon atoms, which may contain ether linkages between carbon atoms; y is at least 1; and p provides a moiety weight of 400 to 10,000; each of E and $E^1$ independently denotes a polymerizable unsaturated organic radical represented by formula:

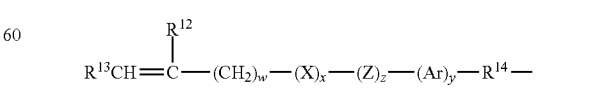

Formula VIII wherein: $R^{12}$ is hydrogen or methyl; $R^{13}$ is hydrogen, an alkyl radical having 1 to 6 carbon atoms, or a —CO—Y—$R^{15}$ radical wherein Y is —O—, Y—S— or —NH—; $R^{14}$ is a divalent radical having 1 to 12 carbon atoms; X denotes —CO— or —OCO—; Z denotes —O— or —NH—; Ar denotes an aromatic radical having 6 to 30 carbon atoms; w is 0 to 6; x is 0 or 1; y is 0 or 1; and z is 0 or 1.

In some embodiments, a preferred silicone-containing component is a polyurethane macromer represented by the following formula:

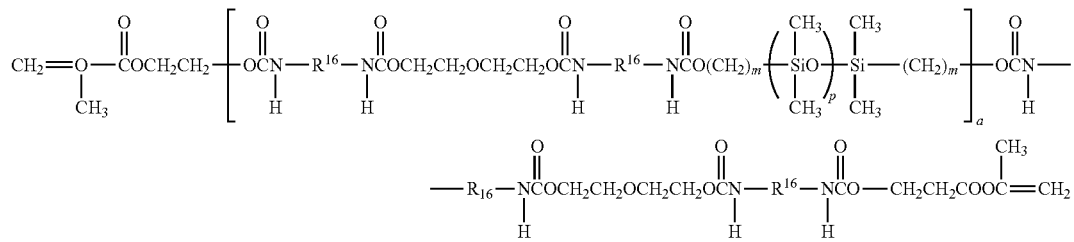

Formula IX wherein $R^{16}$ is a diradical of a diisocyanate after removal of the isocyanate group, such as the diradical of isophorone diisocyanate. Another suitable silicone containing macromer is compound of formula X (in which x+y is a number in the range of 10 to 30) formed by the reaction of fluoroether, hydroxy-terminated polydimethylsiloxane, isophorone diisocyanate and isocyanatoethylmethacrylate.

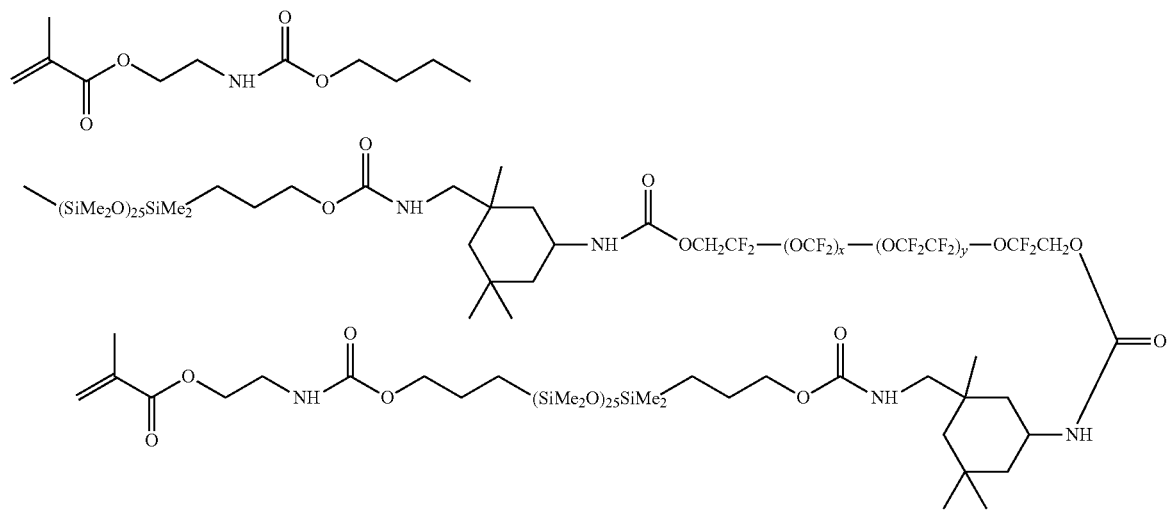

In other embodiments, other silicone containing components suitable for use in this invention include macromers containing polysiloxane, polyalkylene ether, diisocyanate, polyfluorinated hydrocarbon, polyfluorinated ether and polysaccharide groups; polysiloxanes with a polar fluorinated graft or side group having a hydrogen atom attached to a terminal difluoro-substituted carbon atom; hydrophilic siloxanyl methacrylates containing ether and siloxanyl linkanges and crosslinkable monomers containing polyether and polysiloxanyl groups. Any of the foregoing polysiloxanes can also be used as the silicone containing component in this invention.

The following method steps are provided as examples of processes that may be implemented according to some aspects of the present invention. It should be understood that the order in which the method steps are presented is not meant to be limiting and other orders may be used to implement the invention. In addition, not all of the steps are required to implement the present invention and additional steps may be included in various embodiments of the present invention.

Figure 7:
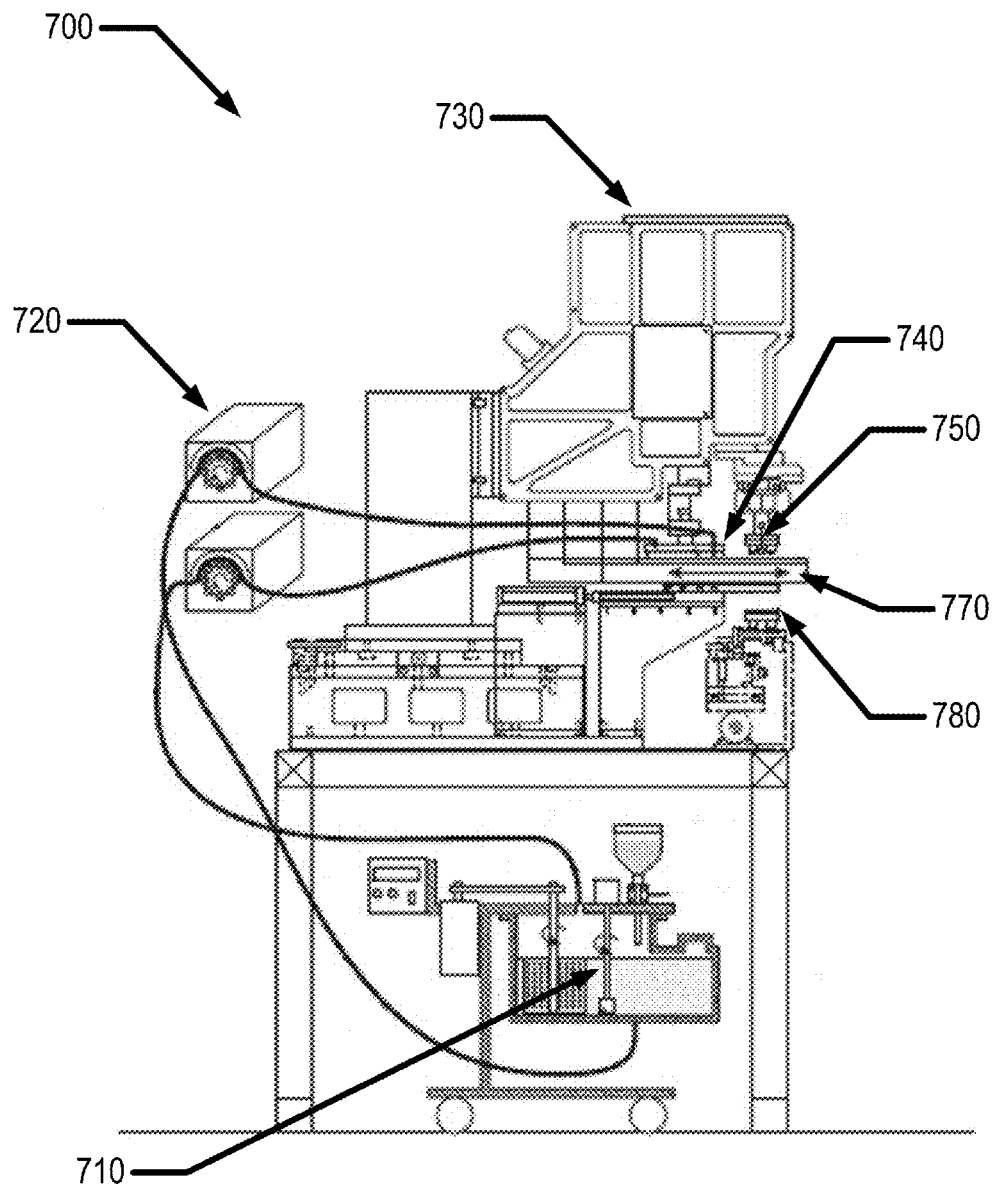
FIG. 7 illustrates an exemplary apparatus to pattern ophthalmic lenses utilizing the principle of pad printing.

Proceeding to FIG. 7, an exemplary apparatus for patterning Ophthalmic Lenses with Inserts is depicted. In some embodiments, methods to pattern surfaces of lenses are disclosed which may include, but not limit to, printing methods, such as pad printing, ink jet printing, silkscreen printing, and screen-printing. Furthermore, there may be other methods such as lithographic or etching processes, where a colorant chemical is applied and imaged by optical techniques to pattern the feature after non-imaged regions are etched away. Other methods may as well include fluid injection techniques wherein, for example, a colorant may be injected into the surface to be patterned by fine needles for example.

In some embodiments, an apparatus 700 represents an exemplary pad printer. In some embodiments, apparatus 700 has reservoirs 710 for the various colorants, as well as pumps 720 to pump colorant to and from to the reservoir. In some other embodiments, a support head 730 of the printer 700 may allow for the support and location control of components of the printing process. In some other embodiments, an applying means 740 to apply the colorants to a patterned surface may be found. In some other embodiments, a patterned surface 742 may allow the colorant to be contained in locations designed for the patterning of the work piece—in this case the Ophthalmic Lens or Insert parts.

In some embodiments, a pad printing head 750 may be present where one or more pads may be controlled for processing. In some embodiments, at the applying means 740 may be moved proximate and under the pad heads 750. In some other embodiments, when the pad head 750 is pressed upon a patterned surface 742, it picks up the colorants in their patterned location. Next, the patterned surface 742 and stage 770 may be moved back to another location as depicted, and the pad head 750 may be made to press upon surfaces of devices attached to a holding feature 780. When pressed onto the surface of an ophthalmic device or a portion of an Insert, the pad may transfer the colorant to such surface; therefore, patterning the ophthalmic device or the surface of the portion of an insert.

Figure 8:
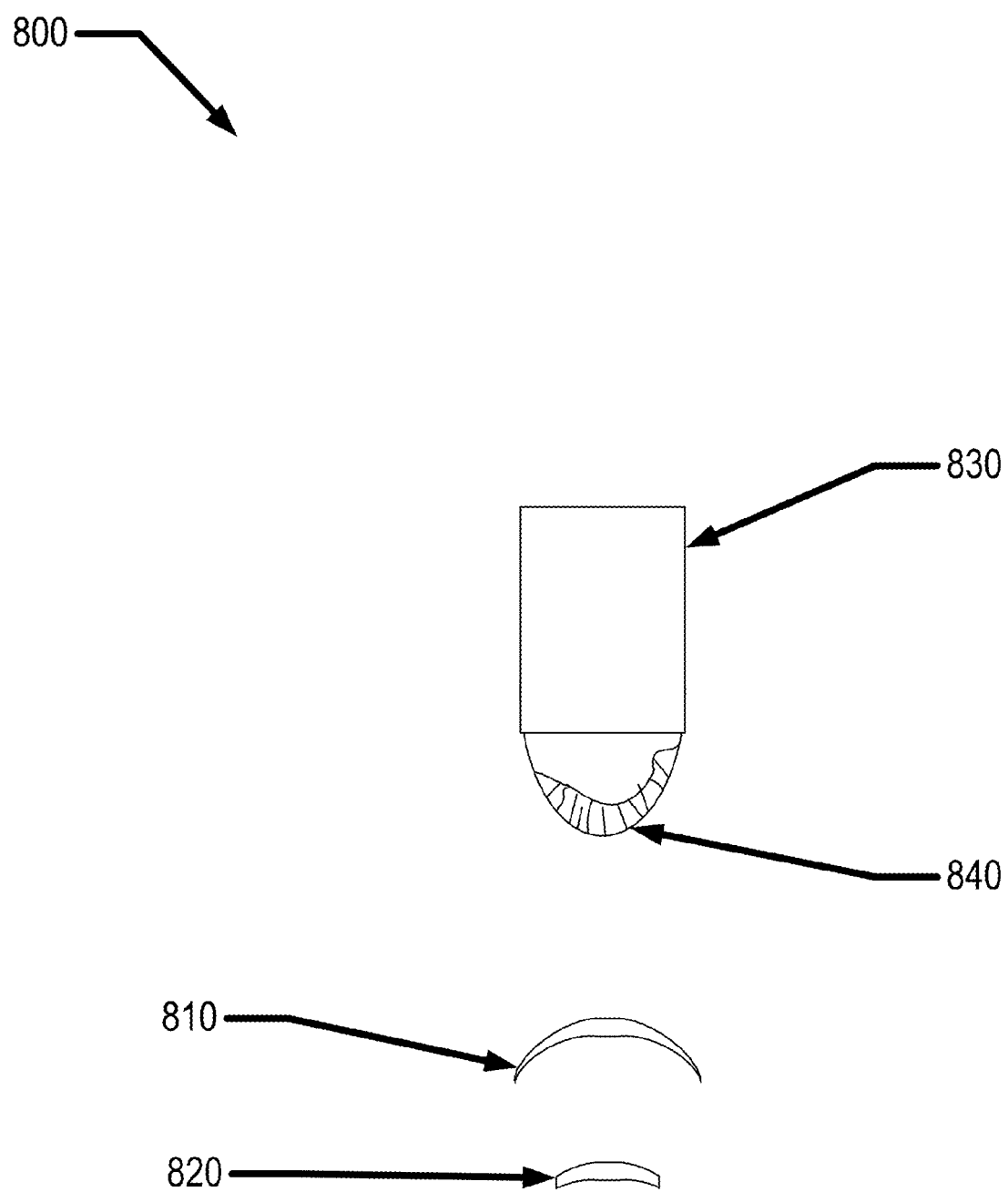
FIG. 8 illustrates patterning by pad printing on the front curve surfaces of both ophthalmic lenses and inserts for ophthalmic lenses.

Proceeding to FIG. 8, a close up of the exemplary pad printing process 800 may be depicted. In some embodiments, a formed Ophthalmic Lens device 810 may include a Multi-piece Insert within it. For demonstration purposes, the lens is shown in isolation, but in some embodiments, it may be affixed upon a back curve molding surface or other such support. In some embodiments, portions of a Multi-piece Insert 820 may be patterned. In some other embodiments, a pad-printing pad 830 may be present where a pattern of colorant has been applied to the pad's surface 840. When the pad is pressed upon either the surface of Ophthalmic Lens 810 or the surface of Multi-piece Insert 820, it may transfer the pattern to the surface and thus pattern the device.

Figure 9:
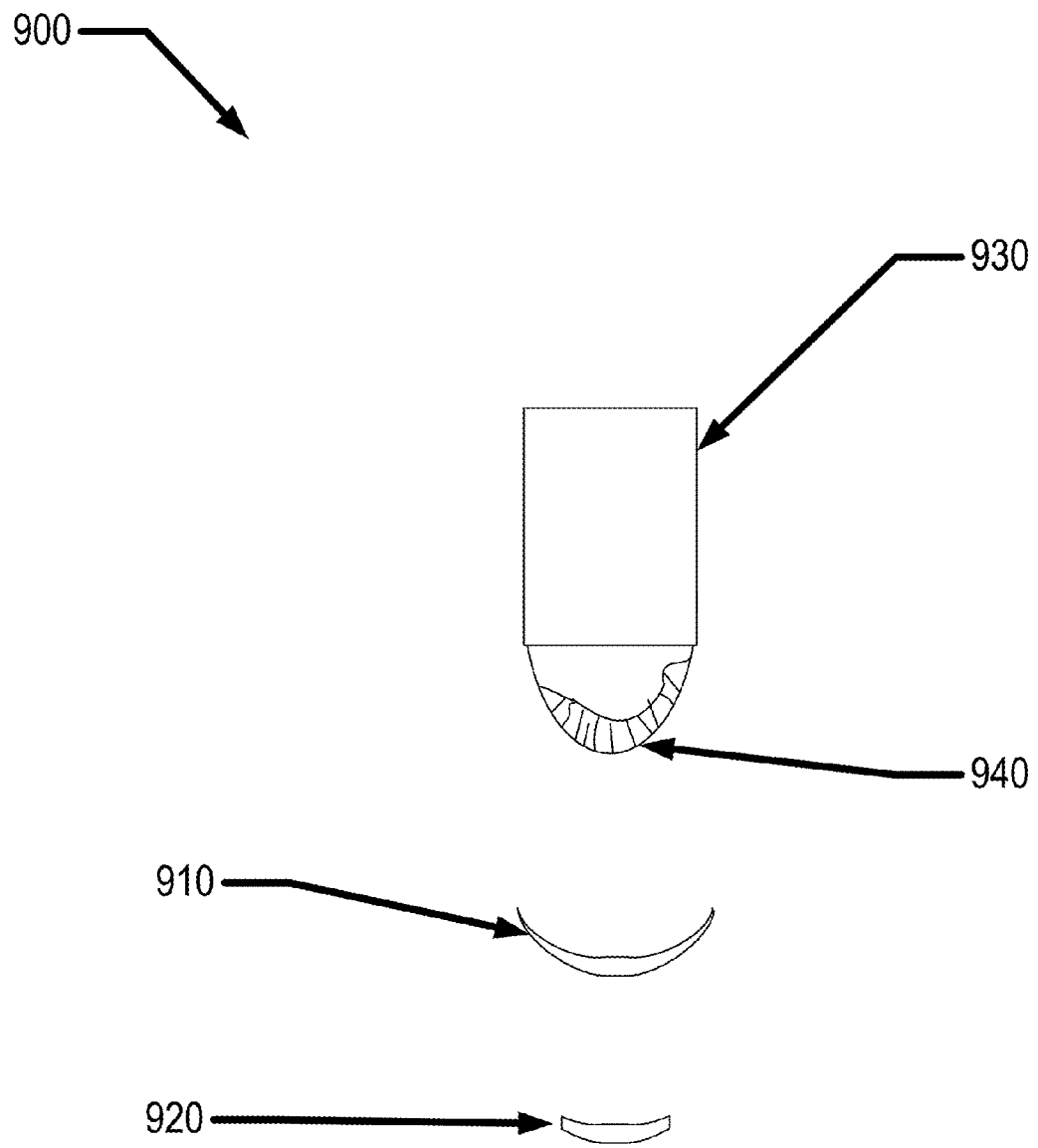
FIG. 9 illustrates patterning by pad printing on the back curve surfaces of both ophthalmic lenses and inserts for ophthalmic lenses.

Proceeding to FIG. 9, a close up 900 of the same exemplary pad printing discussed in reference to FIG. 8 may be found. In a similar fashion, an Ophthalmic Lens device 910 with embedded Insert 920 may be represented. In some embodiments, Ophthalmic Lens 910 and Insert 920 may be supported by a support base (not shown). In some embodiments, pad, 930 may be pressed into the back of the Ophthalmic Lens device 910, Insert 920 in order to transfer pattern 940 from the pad 930 to the surface of these devices.

Proceeding to FIG. 10, a flow chart for patterning an ophthalmic device with Multi-Piece inserts is presented. At step 1001, an ophthalmic insert front curve piece is formed with at least a surface portion for sealing to a second insert piece. Next, at step 1002, an ophthalmic insert back curve piece may be formed also with at least a surface portion for sealing. In some embodiments, the actual order of these two steps may be reversed or they may occur simultaneously. Furthermore, in some embodiments, a conductive material may be placed upon one or both of the first insert front curve piece and first insert back curve piece of the Insert. In some other embodiments, an electronic component may be attached to one or both of the first insert front curve piece and first insert back curve piece, wherein an attachment is made at least in part to the conductive material. In variations of the method shown in FIG. 10, it may be assumed that the steps of depositing conductive material and attaching electronic components at least in part thereon are within the scope of the inventive art.

Next, at step 1003a method for applying adhesive material to either or both of the front curve and back curve pieces are depicted. At step 1004, a colorant material may be applied to a surface of either or both of the front curve and back curve pieces. In some embodiments, various techniques of applying the colorant may be used including, for example, pad printing. In some embodiments, the applied colorant may be cured.

Continuing with step 1005, a reactive mixture may be applied in a first mold part in a formed cavity to mold an Ophthalmic Lens. The amount of reactive mixture may be a small amount to allow for an Insert to be placed within the mixture subsequently at step 1005.

At step 1006, an Insert may be positioned in contact with the reactive mixture before a second mold part is positioned proximate to the first mold part. At step 1007, a cavity is formed to mold the Ophthalmic Lens. Next, at step 1008, the reactive mixture may be polymerized to form a composite Ophthalmic Lens that formed from a polymerized reactive mixture, where the polymerization occurs around a placed insert. In some embodiments, at step 1009, various methods of removing the polymerized material from the molds may be employed to free the patterned Ophthalmic Lens product.

Preceding to FIG. 11, another exemplary flow chart for patterning an Ophthalmic Lens device with Multi-piece Inserts is presented where the patterning occurs after the ophthalmic device is formed. At step 1101, an ophthalmic insert front curve piece is formed with at least a surface portion for sealing to a second insert piece. Next, at step 1102, an ophthalmic insert back curve piece may be formed also with at least a surface portion for sealing. The actual order of these two steps may be reversed or they may occur simultaneously.

Next step 1103 defines a method step for applying adhesive material to either or both of the front curve and back curve pieces. Continuing with step 1104, a reactive mixture may be applied in a first mold part in a location that will form a cavity to mold an Ophthalmic Lens. In some embodiments, at step 1104, the amount of reactive mixture may be a small amount to allow an insert to be placed within the mixture.

In some embodiments, at step 1105, an Insert may be positioned in contact with the reactive mixture before a second mold part is positioned proximate to the first mold part. At step 1106, a cavity is formed to mold the Ophthalmic Lens. Next, at step 1107, the reactive mixture may be polymerized to form a composite Ophthalmic Lens formed from a polymerized reactive mixture, where the polymerization occurs around a placed Insert. In some embodiments, various methods of removing the polymerized material from the molds may be employed at step 1108 to free a side of the Ophthalmic Lens product from either of the first or second mold parts.

At step 1109, a colorant material may be applied to a surface of either the front curve side or the back curve side of the Ophthalmic Lens. The various manners of applying the colorant discussed may be used including, for example, pad printing. In some embodiments, the applied colorant may be cured. In addition, in some embodiments, the applied colorant may be coated with a thin, conformal coating of reactive mixture that may be fixed in place to embed the patterning underneath the outer surface of the lenses. In some other embodiments, the patterning process may inject the colorant underneath the surface layer either by imparting the colorant with enough energy to penetrate the surface or alternatively by injecting the colorant through the surface with, for example, a needle. After the colorant is applied, and optionally cured and embedded the Ophthalmic Lens may be removed from its remaining mold support.

Proceeding to FIG. 12, another exemplary flow chart for patterning an ophthalmic device with Multi-Piece inserts is presented where the patterning occurs after the ophthalmic device is formed. At step 1201, an ophthalmic Insert front curve piece is formed with at least a surface portion for sealing to a second insert piece. Next, at step 1202, an ophthalmic Insert back curve piece may be formed also with at least a surface portion for sealing. The actual order of these two steps may be reversed or they may occur simultaneously.

Next, step 1203 defines a method step for applying adhesive material to either or both of the front curve and back curve pieces. Continuing with step 1204, a reactive mixture may be applied in a first mold part in a location that will form a cavity to mold an Ophthalmic Lens. In some embodiments, at step 1204, the amount of reactive mixture may be a small amount to allow an Insert to be placed within the mixture.

At step 1205, an Insert may be positioned in contact with the reactive mixture before a second mold part is positioned proximate to the first mold part. At step 1206, a cavity is formed to mold the Ophthalmic Lens. Next, at step 1207 the reactive mixture may be polymerized to form a composite Ophthalmic Lens formed from a polymerized reactive mixture, where the polymerization occurs around a placed insert. In some embodiments, at step 1208, various methods of removing the polymerized material from the molds may be employed to free both sides of the Ophthalmic Lens product from the first and second mold parts. In some embodiments, the released Ophthalmic Lens may next be placed on a supporting substrate for further processing.

At step 1209, a colorant material may be applied to a surface of either or both of the front curve side and back curve side of the Ophthalmic Lens. In some embodiments, various manners of applying the colorant may be used including, for example, pad printing. In some embodiments, the applied colorant is cured. Moreover, in some embodiments, the applied colorant may be coated with a thin, sometimes conformal coating of reactive mixture that may be fixed in place to embed the patterning underneath the outer surface of the lenses. In other embodiments, the patterning process may inject the colorant underneath the surface layer either by imparting the colorant with enough energy to penetrate the surface or alternatively by injecting the colorant through the surface with, for example, a needle. In some embodiments, after the colorant is applied, and optionally cured and embedded the Ophthalmic Lens may be removed from the supporting substrate.

Referring now to FIG. 12, a flowchart illustrates exemplary steps that may be used to implement the present invention. At step 1201, a front curve piece is formed. At step 1202, the order of this formation relative to the formation of a back curve piece is shown. For example, the formation of the back curve piece may precede formation of the front curve piece or their formation may be simultaneous. At step 1203, a conductive material may be applied to either or both the front curve piece of the insert or the back curve piece of the insert.

At step 1204, an adhesive or sealing material may be applied to one or both of the front curve piece and the back curve piece. In some embodiments, the application of this material may involve the placement of a preformed piece upon one or both of the insert pieces. In some additional embodiments, there may be more than one front curve piece or one back curve piece, or more than one of both pieces. In some embodiments, step 1204 may be repeated until all applicable pieces of the ophthalmic Insert are combined into an Insert.

At step 1205, a reactive monomer mix may be deposited between a first mold part and a second mold part, or onto a surface of either the first and second mold parts that will be between the two parts in subsequent processing steps.

At step 1206, the combined Insert is placed into a cavity formed by the first mold part and the second mold part, or onto a surface that will be in a cavity formed by the first mold part and the second mold part later. In some preferred embodiments, the combined Insert 104 of FIG. 1 is placed in the mold part 101-102 of FIG. 1, via mechanical placement. In some embodiments, mechanical placement may include, for example, a robot or other automation, such as those known in the industry to place surface mount components. In some other embodiments, human placement of an Insert 104 is also within the scope of the present invention. Accordingly, any mechanical placement effective to place an Insert 104 within a cast mold part such that the polymerization of a Reactive Mixture contained by the mold part will include the Insert in a resultant Ophthalmic Lens.

In some embodiments, a processor device, MEMS, NEMS or other component may also be mounted in or on the Insert and be in electrical communication with an Energy Source.

At step 1207, the first mold part can be placed proximate to the second mold part to form a lens-forming cavity with at least some of the reactive monomer mix and the Energy Source in the cavity. At step 1208, the reactive monomer mix within the cavity can be polymerized. In some embodiments, polymerization can be accomplished, for example, via exposure to one or both of actinic radiation and heat. At step 1209, the lens is removed from the mold parts.

Although the invention may be used to provide hard or soft contact lenses made of any known lens material, or material suitable for manufacturing such lenses, preferably, the lenses of the invention are soft contact lenses having water contents of about 0 to about 90 percent. More preferably, the lenses are made of monomers containing hydroxy groups, carboxyl groups, or both or be made from silicone-containing polymers, such as siloxanes, hydrogels, silicone hydrogels, and combinations thereof. Material useful for forming the lenses of the invention may be made by reacting blends of macromers, monomers, and combinations thereof along with additives such as polymerization initiators. Suitable materials include, without limitation, silicone hydrogels made from silicone macromers and hydrophilic monomers.

Proceeding to FIG. 13, a flow chart for patterning an ophthalmic device with Multi-Piece inserts is presented. At step 1301, an ophthalmic Insert front curve piece is formed with at least a surface portion for sealing to a second insert piece. Next, at step 1302, an ophthalmic insert back curve piece may be formed also with at least a surface portion for sealing. The actual order of these two steps may be reversed or they may occur simultaneously.

At step 1303, a colorant material may be applied to a surface of either or both of the front curve and back curve pieces. In some embodiments, various manners of applying the colorant may be used including, for example, pad printing. In some embodiments, the applied colorant is cured. Next, at step 1304, a method for applying adhesive material to either or both of the front curve and back curve pieces is disclosed.

Continuing with step 1305, a reactive mixture may be applied in a first mold part in a location that will form a cavity to mold an Ophthalmic Lens. At step 1305, in some embodiments, the amount of reactive mixture may be a small amount to allow an insert to be placed within the mixture.

At step 1306, an Insert may be positioned into contact with the reactive mixture before a second mold part is positioned proximate to the first mold part. In some embodiments, at step 1307*a* cavity is formed. Next, at step 1308, the reactive mixture may be polymerized to form a composite Ophthalmic Lens formed from a polymerized reactive mixture, where the polymerization occurs around a placed insert. At step 1309, various methods of removing the polymerized material from the molds may be employed to free the patterned Ophthalmic Lens product.

Figure 14:
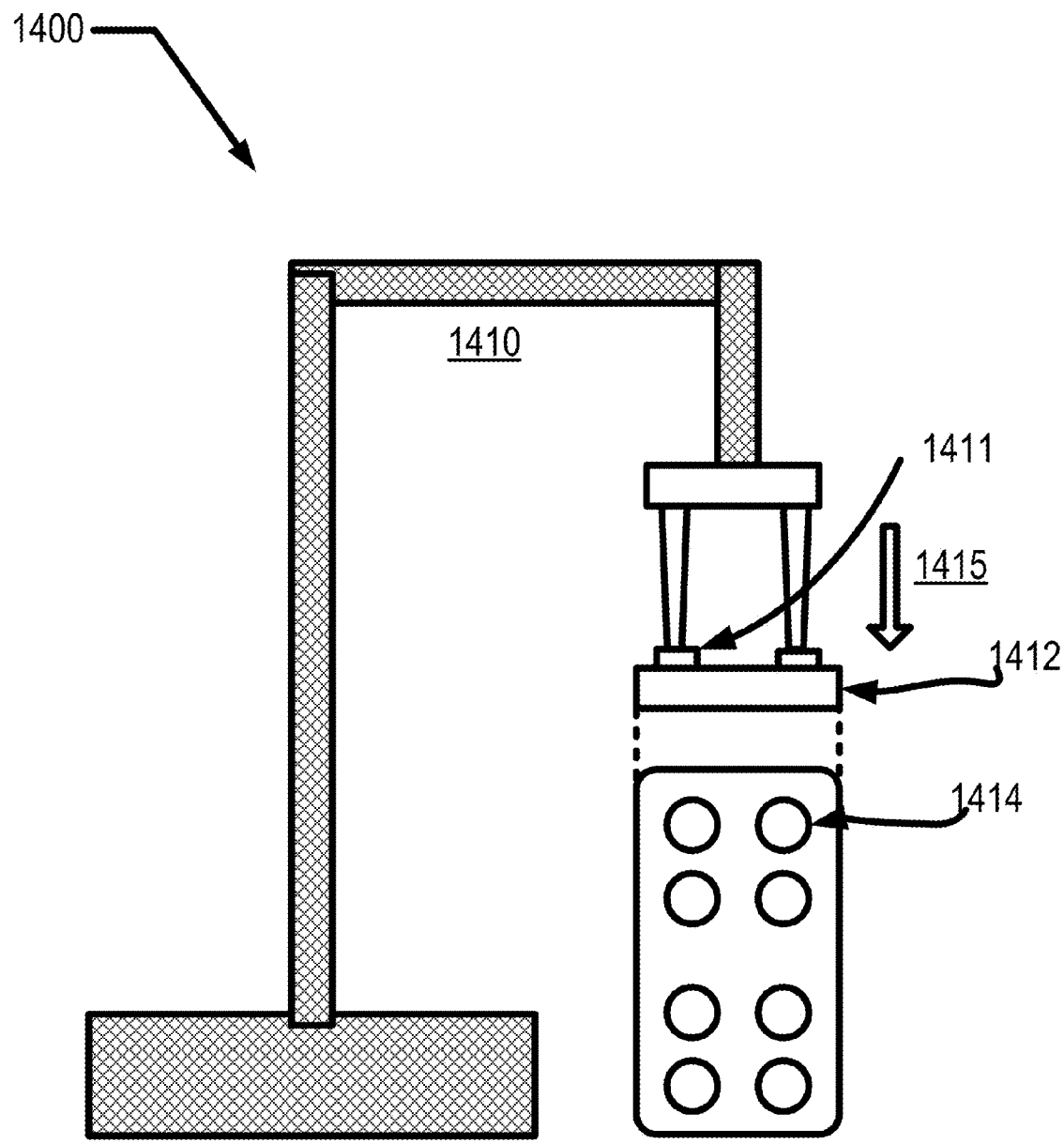
FIG. 14 illustrates an apparatus for placing a sealed insert within an ophthalmic lens mold part.

Referring now to FIG. 14, an automated apparatus 1410 is illustrated with one or more Inserts 1414, and transfer interfaces 1411. As illustrated, multiple mold parts, each with an associated Insert 1414 may be contained on a pallet 1412 and may be presented to an insert transfer interface 1411. In some embodiments, a single interface 1415 may be individually placed on Multi-piece Inserts 1414. Alternatively, in some embodiments, multiple interfaces (not shown) may be simultaneously placed on a single interface 1415 Multi-piece Inserts 1414 in multiple mold parts, or in each mold.

In some other embodiments, apparatus 1400 includes a Multi-piece Insert 1414 while the body of the Ophthalmic Lens is molded around these components. The holding points may be affixed with polymerized material of the same type that will be formed into the lens body.

Figure 15:
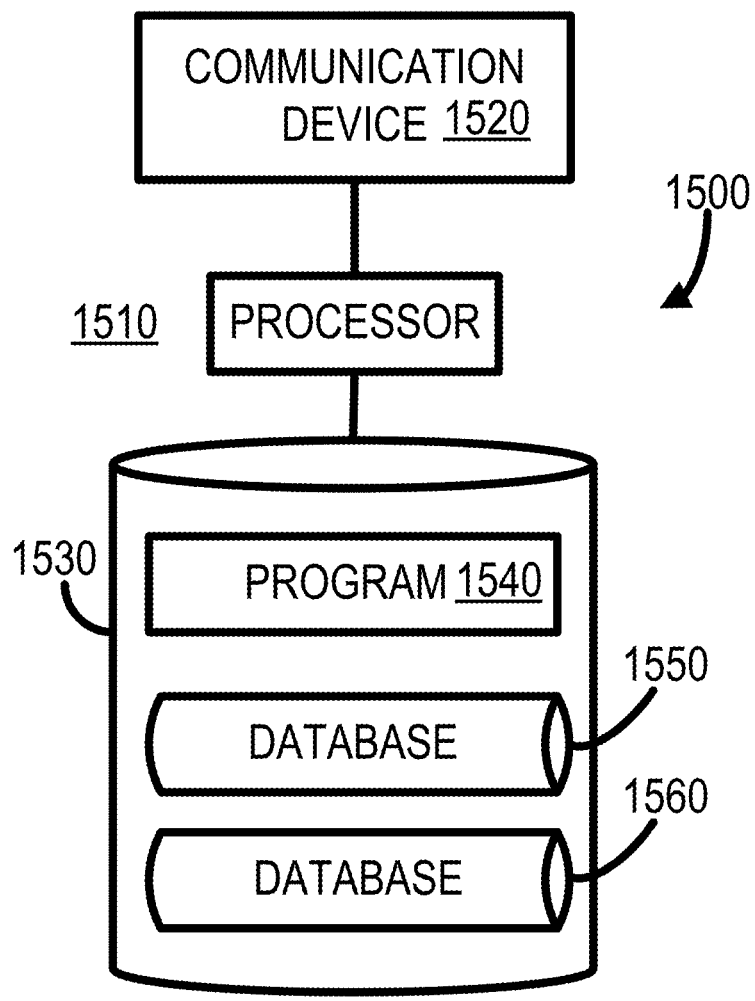
FIG. 15 illustrates a processor that may be used to implement some embodiments of the present invention.

Referring now to FIG. 15, a controller 1500 is illustrated that may be used in some embodiments of the present invention. The controller 1500 includes one or more processors 1510, which may include one or more processor components coupled to a communication device 1520. In some embodiments, a controller 1500 can be used to transmit energy to an Energy Source placed in the Ophthalmic Lens. In some embodiments, all the aforementioned components may be located within a Multi-piece Insert where the multiple pieces are sealed to define interior and exterior regions of the insert.

In some embodiments, the processors 1510 are coupled to a communication device configured to communicate energy via a communication channel. In some embodiments, the communication device may be used to electronically control one or more of: automation used in the placement of an insert into the Ophthalmic Lens mold part and the transfer of digital data to and from a component mounted on or in an the insert media and placed within an Ophthalmic Lens mold part or to control a component incorporated into the Ophthalmic Lens.

In some embodiments, the communication device 1520 may also be used to communicate, for example, with one or more controller apparatus or manufacturing equipment components.

The processor 1510 is also in communication with a storage device 1530. The storage device 1530 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

In some embodiments, the storage device 1530 can store a program 1540 for controlling the processor 1510. The processor 1510 performs instructions of a software program 1540, and thereby operates in accordance with the present invention. For example, the processor 1510 may receive information descriptive of an Insert placement, component placement, and the like. The storage device 1530 can also store ophthalmic related data in one or more databases 1550 and 1560. The database may include customized Insert designs, metrology data, and specific control sequences for controlling energy to and from an Insert.

CONCLUSION

The present invention, as described above and as further defined by the claims below, provides methods for patterning Multi-piece Inserts and or Ophthalmic Lens formed with embedded Inserts. The present invention also includes apparatus for implementing such methods, as well as Ophthalmic Lenses formed with the Multi-piece Inserts, which have been patterned.

The invention claimed is:

1. A method of forming a patterned multi-piece insert for an ophthalmic lens, the method comprising:
    forming a first insert back curve piece;
    forming a first insert front curve piece;
    depositing a conductive material onto one or both of the first insert front curve piece and first insert back curve piece;
    attaching an electronic component at least in part to the conductive material;
    placing an adhesive material onto a surface of one or both of the first insert front curve piece and first insert back curve piece so that a first ophthalmic insert is sealed when the first insert front and back curve pieces are combined;
    combining the first insert back curve piece with the first insert front curve piece to form the first ophthalmic insert; and
    applying a colorant to at least one surface of one or both of the first insert back curve piece and the first insert front curve piece.

2. The method of claim 1, comprising applying the colorant by a lithographic imaging process.

3. The method of claim 1, comprising applying the colorant after combining the first insert back curve piece with the first insert front curve piece to form the first ophthalmic insert.

4. The method of claim 3, further comprising the step of curing the colorant.

5. The method of claim 1, comprising applying the colorant to at least one surface of one or both of the first insert back curve piece and the first insert front curve piece before combining the first insert back curve piece and the first insert front curve piece to form the first ophthalmic insert.

6. The method of claim 5, further comprising the step of curing the colorant.

7. The method of claim 1, comprising applying the colorant by a pad printing process.

8. The method of claim 1, comprising applying the colorant by an ink jet printing process.

9. The method of claim 1, comprising applying the colorant by a screen printing process.

* * * * *